(12) United States Patent
Kim et al.

(10) Patent No.: US 11,355,528 B2
(45) Date of Patent: Jun. 7, 2022

(54) DISPLAY DEVICE

(71) Applicant: Samsung Display Co., Ltd., Yongin-si (KR)

(72) Inventors: Jay Bum Kim, Yongin-si (KR); Myeong Ho Kim, Hwaseong-si (KR); Kyoung Seok Son, Seoul (KR); Seung Jun Lee, Suwon-si (KR); Seung Hun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/890,756

(22) Filed: Jun. 2, 2020

(65) Prior Publication Data

US 2021/0057457 A1  Feb. 25, 2021

(30) Foreign Application Priority Data

Aug. 23, 2019  (KR) .................. 10-2019-0103567

(51) Int. Cl.
*H01L 27/12* (2006.01)
*H01L 27/32* (2006.01)

(52) U.S. Cl.
CPC ...... *H01L 27/1248* (2013.01); *H01L 27/1288* (2013.01); *H01L 27/3258* (2013.01); *H01L 27/3262* (2013.01); *H01L 27/1225* (2013.01); *H01L 2227/323* (2013.01); *H01L 2251/5338* (2013.01)

(58) Field of Classification Search
CPC ............. H01L 27/1248; H01L 27/1288; H01L 27/3258; H01L 27/3262; H01L 27/1225; H01L 2227/323; H01L 2251/5338

USPC .......................................................... 257/71
See application file for complete search history.

(56) References Cited

U.S. PATENT DOCUMENTS

| 2016/0066409 | A1* | 3/2016 | Kwon ................. H01L 27/3276 174/254 |
| 2016/0104757 | A1* | 4/2016 | Kim ................... H01L 27/1225 257/40 |
| 2017/0256569 | A1* | 9/2017 | Ohara ................. H01L 27/1251 |
| 2017/0278901 | A1* | 9/2017 | Kim .................... H01L 27/3246 |

(Continued)

FOREIGN PATENT DOCUMENTS

| KR | 10-2007-0072207 A | 7/2007 |
| KR | 10-2018-0137640 A | 12/2018 |

*Primary Examiner* — Dzung Tran
(74) *Attorney, Agent, or Firm* — Lewis Roca Rothgerber Christie LLP

(57) ABSTRACT

A display device includes: a bending region including a bending peripheral opening passing through the first interlayer insulating film and the first gate insulating film and a bending opening in the bending peripheral opening and passing through the second interlayer insulating film and the buffer layer to expose the substrate, a first sidewall of the bending peripheral opening includes a side surface of the first interlayer insulating film and a side surface of the first gate insulating film, the second interlayer insulating film covers the first sidewall of the bending peripheral opening, the bending opening includes a second sidewall including a side surface of the buffer layer and a portion of a side surface of the second interlayer insulating film arranged with the side surface of the buffer layer, and the first via layer fills the bending opening.

15 Claims, 35 Drawing Sheets

(56) References Cited

U.S. PATENT DOCUMENTS

| | | | |
|---|---|---|---|
| 2018/0366586 A1* | 12/2018 | Son | H01L 27/3276 |
| 2019/0006521 A1 | 1/2019 | Noh et al. | |
| 2019/0189722 A1* | 6/2019 | Lim | H01L 27/3258 |
| 2019/0288048 A1* | 9/2019 | Kang | H01L 27/1218 |
| 2019/0355799 A1* | 11/2019 | Jeong | H01L 27/3262 |

* cited by examiner

Fig. 2
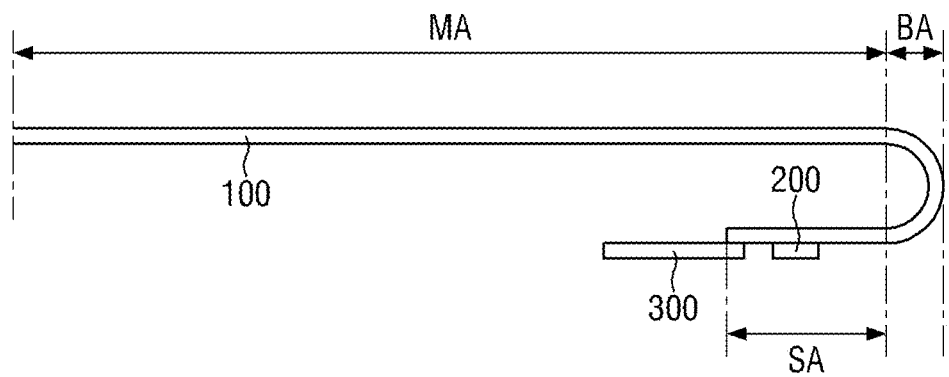
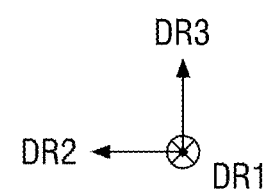

DISPLAY DEVICE

CROSS-REFERENCE TO RELATED APPLICATION

The present application claims priority to and the benefit of Korean Patent Application No. 10-2019-0103567, filed on Aug. 23, 2019, the disclosure of which is incorporated herein by reference in its entirety.

BACKGROUND

1. Field

Aspects of some example embodiments according to the present disclosure relate to a display device.

2. Description of the Related Art

Display devices are becoming increasingly important with the development of multimedia. In response to this, various types of display devices such as liquid crystal displays (LCDs), organic light-emitting diode (OLED) displays, and the like are being used. Among the different types of display devices, the OLED display displays an image using OLEDs that generate light by recombining electrons and holes. The OLED display includes a plurality of transistors that provide a driving current to the OLED.

The above information disclosed in this Background section is only for enhancement of understanding of the background and therefore the information discussed in this Background section does not necessarily constitute prior art.

SUMMARY

Aspects of some example embodiments according to the present disclosure include a display device in which the number of masks used in a manufacturing process may be reduced.

Aspects of some example embodiments according to the present disclosure may also include a method of manufacturing a display device in which the number of masks used in a manufacturing process may be reduced.

The scope of embodiments according to the present disclosure is not limited to the above-described characteristics, and other unmentioned characteristics may be clearly understood by those skilled in the art from the following descriptions.

According to some example embodiments of the present disclosure, in a display device including a main region having a display region and a bending region which is connected to one side of the main region and bent in a thickness direction thereof with respect to the main region, the display device includes: a substrate, a buffer layer on the substrate, a first semiconductor layer on the buffer layer, a first gate insulating film on the first semiconductor layer, a first gate conductive layer on the first gate insulating film, a first interlayer insulating film on the first gate conductive layer, a second gate conductive layer on the first interlayer insulating film, a second interlayer insulating film on the second gate conductive layer, a first data conductive layer on the second interlayer insulating film and a first via layer on the first data conductive layer, wherein the bending region includes a bending peripheral opening passing through the first interlayer insulating film and the first gate insulating film and a bending opening in the bending peripheral opening and passing through the second interlayer insulating film and the buffer layer to expose the substrate, a first sidewall of the bending peripheral opening includes a side surface of the first interlayer insulating film and a side surface of the first gate insulating film, the second interlayer insulating film covers the first sidewall of the bending peripheral opening, the bending opening includes a second sidewall including a side surface of the buffer layer and a portion of a side surface of the second interlayer insulating film arranged with the side surface of the buffer layer, and the first via layer fills the bending opening.

According to some example embodiments of the present invention, in a method of manufacturing a display device including a first transistor having a channel, a second transistor having a channel, and a capacitor, in which the channels are formed of different semiconductor layers, the method includes: forming a buffer layer on a substrate, forming a first semiconductor pattern on the buffer layer, wherein the first semiconductor pattern is formed of a first semiconductor layer and includes a semiconductor pattern of the first transistor, forming a first gate insulating film on the first semiconductor layer, forming a first gate conductive layer on the first gate insulating film, forming a first interlayer insulating film on the first gate conductive layer, forming a second gate conductive layer on the first interlayer insulating film, forming a second interlayer insulating film on the second gate conductive layer, forming a first data conductive layer on the second interlayer insulating film; and forming a first via layer on the first data conductive layer, wherein the forming of the second gate conductive layer further includes forming a bending peripheral opening which passes through the first interlayer insulating film and the first gate insulating film, the forming of the first data conductive layer further includes forming a bending opening which passes through the second interlayer insulating film and the buffer layer and exposes the substrate, a first sidewall of the bending peripheral opening includes a side surface of the first interlayer insulating film and a side surface of the first gate insulating film, the second interlayer insulating film covers the first sidewall of the bending peripheral opening, the bending opening includes a second sidewall including a side surface of the buffer layer and a portion of a side surface of the second interlayer insulating film arranged with the side surface of the buffer layer, and the first via layer fills the bending opening.

In a display device and a method of manufacturing a display device according to some example embodiments of the present invention, the number of masks may be reduced, thereby reducing processing or manufacturing costs and increasing processing or manufacturing efficiency.

Characteristics of embodiments of the present disclosure are not limited by the characteristics described above, and more various characteristics may be learned from the further details described below.

BRIEF DESCRIPTION OF THE DRAWINGS

The above and other aspects and features of embodiments according to the present disclosure will become more apparent by describing aspects of some example embodiments thereof in detail with reference to the attached drawings, in which:

FIG. 2 is a side view of the display device of FIG. 1;

DETAILED DESCRIPTION

Aspects of some example embodiments of the present invention will now be described more fully hereinafter with reference to the accompanying drawings, in which some example embodiments of the invention are shown. Embodiments according to the present disclosure may, however, be embodied in different forms and should not be construed as limited to the example embodiments set forth herein. Rather, these example embodiments are provided so that this disclosure will be more thorough and more complete, and will more fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In concluding the detailed description, those skilled in the art will appreciate that many variations and modifications can be made to the example embodiments without substantially departing from the principles of embodiments according to the present disclosure. Therefore, the disclosed example embodiments according to the present disclosure are used in a generic and descriptive sense only and not for purposes of limitation.

Hereinafter, aspects of some example embodiments will be described in more detail with reference to the accompanying drawings.

Figure 1:
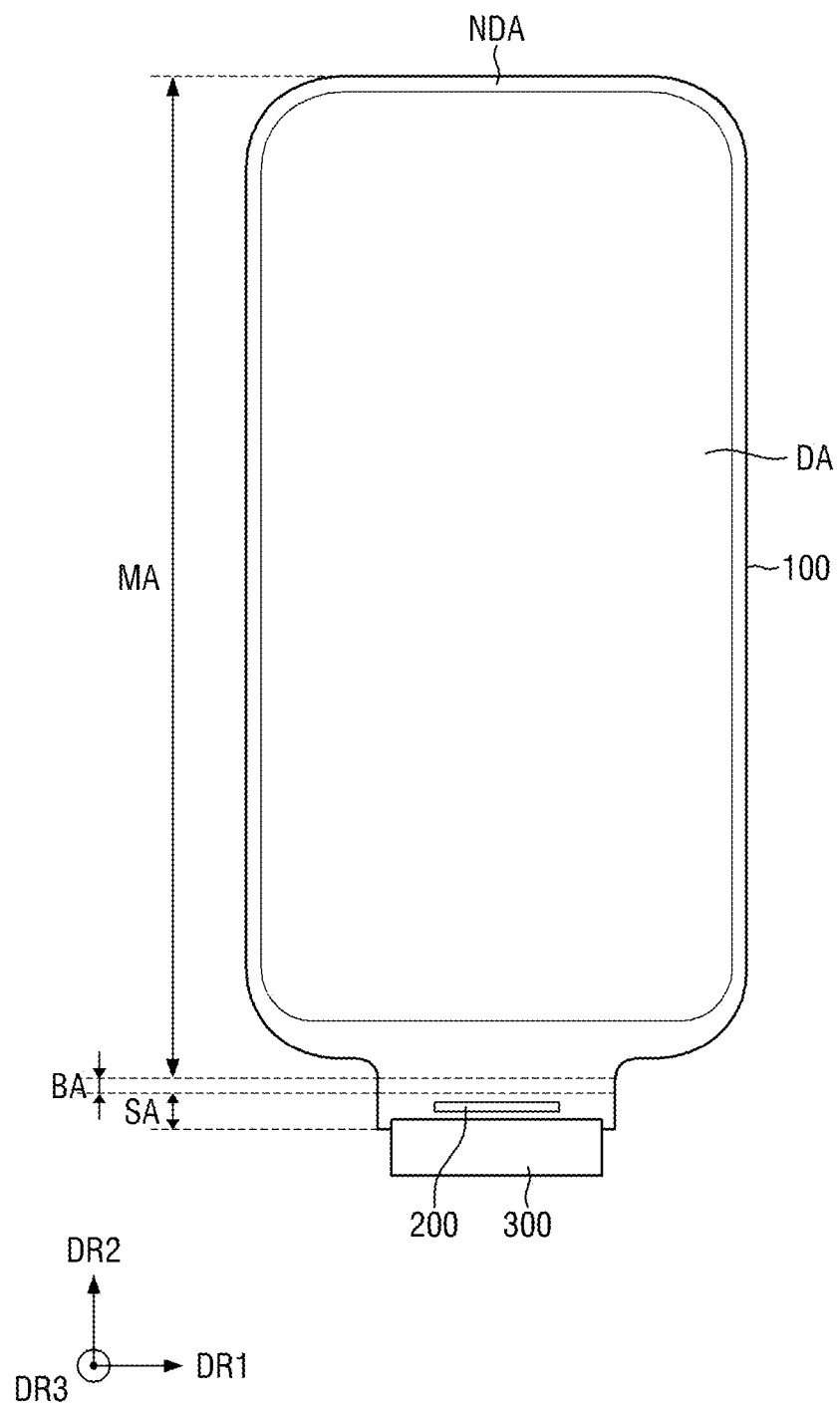
FIG. 1 is a plan view of a display device according to some example embodiments.

FIG. 1 is a plan view of a display device according to some example embodiments. FIG. 2 is a side view of the display device of FIG. 1. FIG. 2 illustrates a shape of a side surface of the display device which is bent in a thickness direction thereof.

A display device 1 may be a device for displaying moving (e.g., video) images or still (e.g., static) images, and the display device 1 may be used as a display screen for portable electronic devices, such as a mobile phone, smart phone, tablet personal computer (PC), smart watch, watch phone, mobile communication terminal, electronic notebook, e-book, portable multimedia player (PMPs), navigation system, and ultra mobile PCs (UMPC) and used as a display screen for various products such as a television, laptop computer, monitor, billboard, and an Internet of Things device.

The display device 1 according to some example embodiments may have a substantially rectangular shape in the plan view (e.g., a direction perpendicular or normal with respect to a plane of the display surface). The display device 1 may have a rectangular shape of which corners are a right angle in the plan view. However, embodiments according to the present disclosure are not limited thereto, and the display device 1 may have a rectangular shape of which corners are rounded in the plan view. Embodiments are not limited to the display device 1 having a rectangular shape, however, and according to some example embodiments the display device 1 may have any suitable shape according to the design of the display device 1.

In the drawings, a first direction DR1 represents a lateral direction of the display device 1 in the plan view and a second direction DR2 represents a longitudinal direction of the display device 1 in the plan view. In addition, a third direction DR3 represents the thickness direction of the display device 1. The first direction DR1 and the second direction DR2 cross each other perpendicularly, and the third direction DR3 is a direction crossing a plane in which the first direction DR1 and the second direction DR2 are placed and crosses to be perpendicular to both of the first direction DR1 and the second direction DR2. However, directions to be described in embodiments should be understood to refer to relative directions for convenience of description, and the embodiments are not limited to the described directions.

Unless otherwise defined, in this specification, the term "upper portion," "upper surface," or "upper side" represented with respect to the third direction DR3 refers to a side of a display surface with respect to a display panel 100, and the term "lower portion," "lower surface," or "lower side" refers to an opposite side of the display surface with respect to the display panel 100.

Referring to FIGS. 1 and 2, the display device 1 may include the display panel 100. The display panel 100 may be a flexible substrate including a flexible polymer material such as polyimide or the like. Accordingly, the display panel 100 may be flexible, bendable, foldable, or rollable.

The display panel 100 may be an organic light-emitting display panel. In the following embodiment, an example in which an organic light-emitting display panel is applied as the display panel 100 is illustrated, but embodiments according to the present disclosure are not limited thereto, and other types of display panels, such as a liquid crystal display (LCD), a quantum dot organic light-emitting display panel (QD-OLED), a quantum dot LCD (QD-LCD), a quantum nano light-emitting display panel (a nano-emissive display (NED)), a micro LED, and the like may be applied as the display panel 100.

The display panel 100 may include a display region DA in which a screen is displayed and a non-display region NDA in which the screen is not displayed. That is, the display region DA may be a region of the display panel 100 configured to display static or video images, and the non-display region NDA may be a region outside of the display region DA (e.g., outside a footprint of the display region DA) where the display panel 100 does not display static or video images (e.g., a bezel area). The display panel 100 may be divided into the display region DA and the non-display region NDA in the plan view. The non-display region NDA may be arranged to surround the display region DA. The non-display region NDA may form a bezel.

The display region DA may have a rectangular shape of which corners are a right angle in the plan view or may be a rectangular shape of which corners are rounded in the plan view. According to some embodiments, the display region DA may have short sides and long sides. The short sides of the display region DA may be sides extending in the first direction DR1. The long sides of the display region DA may be sides extending in the second direction DR2. However, a planar shape of the display region DA is not limited to the rectangular shape, and the display region DA may have any other suitable shape, for example, a circular shape, an elliptical shape, or any other suitable shape according to the design of the display panel 100.

The display region DA may include a plurality of pixels. The pixels may be arranged in a matrix arrangement. Each of the pixels may include a light-emitting layer and a circuit layer which controls a light emission amount of the light-emitting layer. The circuit layer may include a line, an electrode, and at least one transistor. The light-emitting layer may include an organic light-emitting material. The light-emitting layer may be sealed by an encapsulation film. Further details of the configuration of the pixel will be described below The non-display region NDA may be located adjacent to two short sides and two long sides of the display region DA. In this case, the non-display region NDA may surround all the sides of the display region DA and form an edge of the display region DA. However, embodiments according to the present disclosure are not limited thereto, and the non-display region NDA may be located adjacent to only two short sides or two long sides of the display region DA.

The display panel 100 may include a main region MA, which includes the display region DA, and a bending region BA connected to one side of the main region MA in the second direction DR2. The display panel 100 may further include a subregion SA of which one side is connected to the bending region BA in the second direction DR2 and which is bent in the thickness direction thereof to overlap the main region MA in the thickness direction, as illustrated in FIG. 2.

The display region DA may be located in the main region MA. The non-display region NDA may be located at a peripheral edge portion of the display region DA of the main region MA.

The main region MA may have a shape similar to that of an exterior of the display device 1 in the plan view. The main region MA may be a flat region located in one surface. However, embodiments according to the present disclosure are not limited thereto, and at least one of the remaining edges except for the edge (side) of the main region MA connected to the bending region BA may be curved to form a curved surface or may be bent in a vertical direction.

When at least one of the remaining edges except for the edge (side) of the main region MA connected to the bending region BA is curved or bent, the display region DA may also be located at the corresponding edge. However, embodiments according to the present disclosure are not limited thereto, and the non-display region NDA in which the screen is not displayed may be located at the curved or bent edge, or the display region DA and the non-display region NDA may be arranged together at the curved or bent edge.

The non-display region NDA of the main region MA may be placed on a region extending from an outer boundary of the display region DA to the edge of the display panel 100. Signal lines for applying signals to the display region DA or driving circuits may be located in the non-display region NDA of the main region MA.

The bending region BA may be connected to one short side of the main region MA. A width (e.g., a width in the first direction DR1) of the bending region BA may be smaller than a width (e.g., a width of the short side) of the main region MA. A connection portion between the main region MA and the bending region BA may have an L-shaped cut shape in order to reduce a width of a bezel.

In the bending region BA, the display panel 100 may be bent with a curvature in a direction opposite to a direction of a display surface thereof. Because the display panel 100 is bent in the bending region BA, a surface of the display panel 100 may be reversed. That is, one surface of the display panel 100 facing upward may face an outer side of a side surface of the display panel 100 through the bending region BA and then may be changed to face downward.

The subregion SA extends from the bending region BA. The subregion SA may extend from a bending end point in a direction parallel to the main region MA. The subregion SA may overlap the main region MA in the thickness direction of the display panel 100. The subregion SA may overlap the non-display region NDA at the edge of the main region MA and may further overlap the display region DA of the main region MA. A width of the subregion SA may be identical to the width of the bending region BA, but embodiments according to the present disclosure are not limited thereto.

Pad portions may be located on the subregion SA of the display panel 100. External devices may be mounted on (or attached to) the pad portions. Examples of the external device may include a driving chip 200, a driving substrate 300 formed as a flexible printed board or a rigid printed board, and the like. In addition, a line connection film, a connector, and the like may be mounted on the pad portions as the external devices. One or more external devices may be mounted in the subregion SA. For example, as illustrated in FIGS. 1 and 2, the driving chip 200 may be located in the subregion SA of the display panel 100, and the driving substrate 300 may be attached to an end portion of the subregion SA. In this case, the display panel 100 may include both of a pad portion connected to the driving chip 200 and a pad portion connected to the driving substrate 300. As another example, a driving chip may be mounted on a film and the film may be attached to the subregion SA of the display panel 100.

The driving chip 200 may be mounted on one surface of the display panel 100 that is coplanar with the display surface of the display panel 100. As described above, due to the bending region BA being bent and reversed, the driving chip 200 may be mounted on the surface of the display panel 100 facing downward in the thickness direction and thus an upper surface of the driving chip 200 may face downward.

The driving chip 200 may be attached onto the display panel 100 using an anisotropic conductive film or may be attached onto the display panel 100 by ultrasonic bonding. A lateral width of the driving chip 200 may be smaller than a lateral width of the display panel 100. The driving chip 200 may be located on a central portion of the subregion SA in a lateral direction (the first direction DR1), and left and right edges of the driving chip 200 may be spaced apart from left and right edges of the subregion SA, respectively.

The driving chip 200 may include an integrated circuit which drives the display panel 100. In an embodiment, the integrated circuit may be a data driving integrated circuit which generates and provides a data signal, but embodiments according to the present disclosure are not limited thereto. The driving chip 200 is connected to line pads provided on the pad portions of the display panel 100 to provide data signals to the line pads. The lines connected to the line pads extend to the pixels to apply the data signals to the respective pixels.

Figure 3:
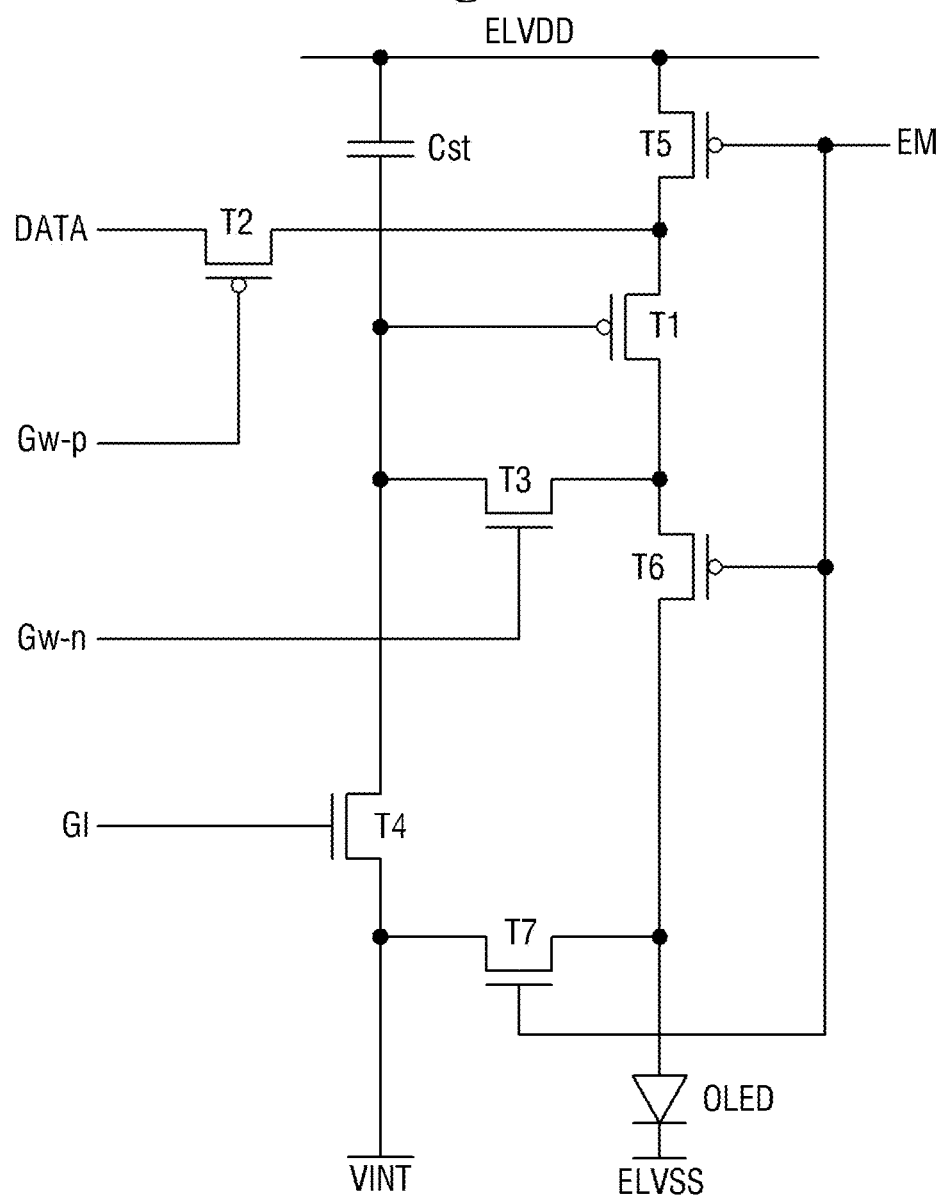
FIG. 3 is an equivalent circuit diagram of one pixel of a display device according to some example embodiments.

FIG. 3 is an equivalent circuit diagram of on pixel of a display device according to some example embodiments.

Referring to FIG. 3, a circuit of one pixel of an organic light-emitting display device includes an organic light-emitting diode OLED, a plurality of transistors T1 to T7, and a capacitor Cst. A data signal DATA, a first scan signal Gw-p, a second scan signal Gw-n, a third scan signal GI, a light-emitting control signal EM, a first power voltage ELVDD, a second power voltage ELVSS, and an initialization voltage VINT are applied to the circuit of the pixel.

The organic light-emitting diode OLED includes an anode electrode and a cathode electrode. The capacitor Cst includes a first electrode and a second electrode.

The plurality of transistors may include first to seventh transistors T1 to T7. Each of the transistors T1 to T7 includes a gate electrode, a first source/drain electrode, and a second source/drain electrode. Any one of the first and second source/drain electrodes of each of the transistors T1 to T7 becomes a source electrode, and the other one becomes a drain electrode.

Each of the transistors T1 to T7 may be a thin film transistor. Each of the transistors T1 to T7 may be any one of a p-type metal-oxide-semiconductor (PMOS) transistor and an n-type metal-oxide-semiconductor (NMOS) transistor. According to some example embodiments, a first transistor T1 serving as a driving transistor, a second transistor T2 serving as a data transfer transistor, a fifth transistor T5 serving as a first light-emitting control transistor, and a sixth transistor T6 serving as a second light-emitting control transistor are PMOS transistors. According to some example embodiments, a third transistor T3 serving as a compensation transistor, a fourth transistor T4 serving as a first initialization transistor, and a seventh transistor T7 serving as a second initialization transistor are NMOS transistors.

The PMOS transistor and the NMOS transistor have different characteristics. The third transistor T3, the fourth transistor T4, and the seventh transistor T7 may be formed as NMOS transistors having relatively high turn-off characteristics, and thus a leakage of a driving current Id during an emission period of the organic light-emitting diode OLED may be reduced.

Hereinafter, further details of various components will be described in more detail.

The gate electrode of the first transistor T1 is connected to the first electrode of the capacitor Cst. The first source/drain electrode of the first transistor T1 is connected to a terminal of the first power voltage ELVDD via the fifth transistor T5. The second source/drain electrode of the first transistor T1 is connected to the anode electrode of the organic light-emitting diode OLED via the sixth transistor T6. That is, according to some example embodiments, the fifth transistor T5, the first transistor T1, the sixth transistor T6, and the organic light-emitting diode OLED may be electrically connected in series (with or without other intervening components). The first transistor T1 receives the data signal DATA according to a switching operation of the second transistor T2 and supplies the driving current Id to the organic light-emitting diode OLED. That is, according to some example embodiments, the first source/drain electrode of the first transistor T1 may be electrically connected to a data line supplying the data signal DATA.

The gate electrode of the second transistor T2 is connected to a terminal of the first scan signal Gw-p. The first source/drain electrode of the second transistor T2 is connected to a terminal configured to receive the data signal DATA. The second source/drain electrode of the second transistor T2 is connected to the terminal of the first power voltage ELVDD via the fifth transistor T5 while being connected to the first source/drain electrode of the first transistor T1. Thus, a node between the first transistor T1 and the fifth transistor T5 may be configured to receive the data signal DATA through the second transistor T2 in response to the first scan signal Gw-p applied to the gate electrode of the second transistor T2. The second transistor T2 is turned on according to the first scan signal Gw-p to perform the switching operation in which the data signal DATA is transmitted to the first source/drain electrode of the first transistor T1.

The gate electrode of the third transistor T3 is connected to a terminal of the second scan signal Gw-n. The first source/drain electrode of the third transistor T3 is connected to the anode electrode of the organic light-emitting diode OLED via the sixth transistor T6 while being connected to the second source/drain electrode of the first transistor T1. The second source/drain electrode of the third transistor T3 is connected to the first electrode of the capacitor Cst, the first source/drain electrode of the fourth transistor T4, and the gate electrode of the first transistor T1. The third transistor T3 is turned on according to the second scan signal Gw-p to connect the gate electrode of the first transistor T1 to the second source/drain electrode and diode-connect the first transistor T1. Accordingly, a voltage difference is generated between the first source/drain electrode of the first transistor T1 and the gate electrode by a threshold voltage of the first transistor T1. Therefore, the data signal DATA may be supplied to the gate electrode of the first transistor T1, with an adjustment or compensation made to the data signal DATA according to the threshold voltage of the first transistor T1, so that a deviation of the threshold voltage of the first transistor T1 may be compensated for.

The gate electrode of the fourth transistor T4 is connected to a terminal of the third scan signal GI. The second source/drain electrode of the fourth transistor T4 is connected to a terminal of the initialization voltage VINT. The first source/drain electrode of the fourth transistor T4 is connected to the first electrode of the capacitor Cst, the second source/drain electrode of the third transistor T3, and the gate electrode of the first transistor T1. The fourth transistor T4 is turned on according to the third scan signal GI to perform an operation in which the initialization voltage VINT is transmitted to the gate electrode of the first transistor T1 so that a voltage of the gate electrode of the first transistor T1 is initialized.

The gate electrode of the fifth transistor T5 is connected to a terminal of the light-emitting control signal EM. The first source/drain electrode of the fifth transistor T5 is connected to the terminal of the first power voltage ELVDD. The second source/drain electrode of the fifth transistor T5 is connected to the first source/drain electrode of the first transistor T1 and the second source/drain electrode of the second transistor T2. According to some example embodiments, the second source/drain electrode of the fifth transistor T5, the first source/drain electrode of the first transistor T1, and the second source/drain electrode of the second transistor T2 may form a node.

The gate electrode of the sixth transistor T6 is connected to the terminal of the light-emitting control signal EM. The first source/drain electrode of the sixth transistor T6 is connected to the second source/drain electrode of the first transistor T1 and the first source/drain electrode of the third transistor T3. The second source/drain electrode of the sixth transistor T6 is connected to the anode electrode of the organic light-emitting diode OLED.

The fifth transistor T5 and the sixth transistor T6 are turned on simultaneously according to the light-emitting control signal EM so that the driving current Id flows into the organic light-emitting diode OLED.

The gate electrode of the seventh transistor T7 is connected to the terminal of the light-emitting control signal EM. The first source/drain electrode of the seventh transistor T7 is connected to the anode electrode of the organic light-emitting diode OLED. The second source/drain electrode of the seventh transistor T7 is connected to the terminal of the initialization voltage VINT. The seventh transistor T7 is turned on according to the light-emitting control signal EM to initialize the anode electrode of the organic light-emitting diode OLED.

The seventh transistor T7 receives the same light-emitting control signal EM as the fifth transistor T5 and the sixth transistor T6. However, because the seventh transistor T7 is the NMOS transistor and the fifth transistor T5 and the sixth transistor T6 are the PMOS transistors, the seventh transistor T7 may be turned on at a different timing from the fifth transistor T5 and the sixth transistor T6. That is, when the light-emitting control signal EM is a high level, the seventh transistor T7 is turned on and the fifth transistor T5 and the sixth transistor T6 are turned off. When the light-emitting control signal EM is a low level, the seventh transistor T7 is turned off and the fifth transistor T5 and the sixth transistor T6 are turned on. Therefore, the initialization operation by the seventh transistor T7 may not be performed at an emission time point at which the fifth transistor T5 and the sixth transistor T6 are turned on, and the initialization by the seventh transistor T7 may be performed at a non-emission time point at which the fifth transistor T5 and the sixth transistor T6 are turned off.

In the present embodiment, an example in which the gate electrode of the seventh transistor T7 receives the light-emitting control signal EM is illustrated. However, as another example, the circuit of the pixel may be configured such that the gate electrode of the seventh transistor T7 receives the third scan signal GI.

The second electrode of the capacitor Cst is connected to the terminal of the first power voltage ELVDD. The first electrode of the capacitor Cst is connected to the gate electrode of the first transistor T1, the second source/drain electrode of the third transistor T3, and the first source/drain electrode of the fourth transistor T4. The cathode electrode of the organic light-emitting diode OLED is connected to the terminal of the second power voltage ELVSS. The organic light-emitting diode OLED receives the driving current Id from the first transistor T1 and emits light to display an image.

Figure 4:
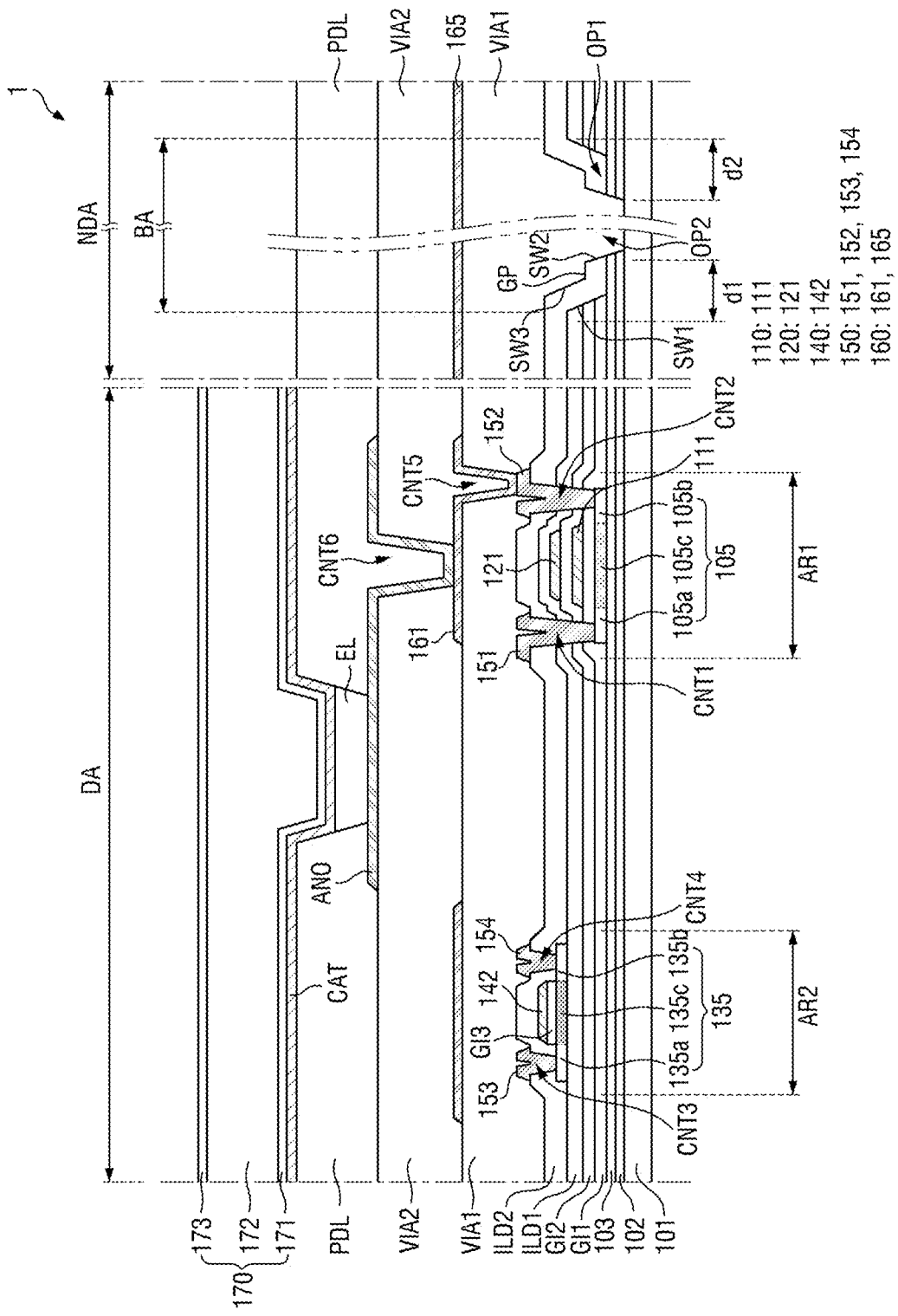
FIG. 4 is a cross-sectional view illustrating an example cross section of one pixel and a periphery of a bending region of a non-display region.

Hereinafter, a cross-sectional structure of a display panel 100 will be described in detail with reference to FIG. 4. FIG. 4 illustrates an example of a cross-sectional structure of one pixel of a display region DA of the display panel 100 and a non-display region NDA including a bending region BA.

FIG. 4 is a cross-sectional view illustrating an example cross section of a pixel of a display region and a periphery of a bending region of a non-display region.

First, the display region DA of the display panel 100 will be described in more detail with reference to FIG. 4.

The display region DA may include a silicon transistor region AR1 in which a non-oxide inorganic semiconductor transistor (hereinafter, abbreviated as "a silicon transistor") including polycrystalline silicon serving as a channel is located, and an oxide transistor region AR2 in which an oxide semiconductor transistor (hereinafter, abbreviated as "an oxide transistor") including an oxide semiconductor serving as a channel is located. The silicon transistor located in the silicon transistor region AR1 may be a PMOS transistor, and in FIG. 4, a first transistor T1 serving as a driving transistor is illustrated as an example of the silicon transistor. The oxide transistor located in the oxide transistor region AR2 may be an NMOS transistor, and in FIG. 4, a third transistor T3 serving as a compensation transistor is illustrated as an example of the oxide transistor. According to some example embodiments, a second transistor T2, a fifth transistor T5, and a sixth transistor T6, which are other silicon transistors located in the silicon transistor region AR1, may have substantially the same stacked structure as the first transistor T1, and a fourth transistor T4 and a seventh transistor T7, which are other oxide transistors located in the oxide transistor region AR2, may have substantially the same stacked structure as the third transistor T3. Further details of the silicon transistor and the oxide transistor will be described below.

A base substrate 101, a barrier layer 102, a buffer layer 103, a silicon semiconductor layer 105, a first gate insulating film GI1, a first conductive layer 110, a second gate insulating film GI2, a second conductive layer 120, a first interlayer insulating film ILD1, an oxide semiconductor layer 135, a third gate insulating film GI3, a third conductive layer 140, a second interlayer insulating film ILD2, a fourth conductive layer 150, a first via layer VIA1, a fifth conductive layer 160, a second via layer VIA2, a anode electrode ANO, and a pixel definition film PDL may be sequentially located in the display region DA of the display panel 100. Each of the above-described layers may be formed as a single film or may be formed as a stacked film including a plurality of films. Another layer may be further located between the layers.

The base substrate 101 supports the respective layers located thereabove. The base substrate 101 may be made of, for example, an insulating material such as a polymer resin or the like. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may include a metal material.

The base substrate 101 may be a flexible substrate which is bendable, foldable, or rollable. An example of the material forming the flexible substrate may include PI, but embodiments according to the present disclosure are not limited thereto.

When an organic light-emitting display device is a backside or double-sided emission type, a transparent substrate may be used. When the organic light-emitting display device is a top emission type, not only a transparent substrate but also a translucent or opaque substrate may be used.

The barrier layer 102 may be located on the base substrate 101. The barrier layer 102 may prevent or reduce the diffusion of impurity ions, prevent or reduce the penetration of moisture or external air, and perform a surface planarization function. The barrier layer 102 may include silicon nitride, silicon oxide, silicon oxynitride, or the like. The barrier layer 102 may be omitted according to a type of the base substrate 101, process conditions, or the like.

The buffer layer 103 may be located on the barrier layer 102. The buffer layer 103 may include at least one of silicon nitride, silicon oxide, silicon oxynitride, and the like. The buffer layer 103 may be omitted according to the type of the base substrate 101, the process conditions, or the like.

The silicon semiconductor layer 105 may be located on the buffer layer 103. The silicon semiconductor layer 105 may be located in the silicon transistor region AR1.

The silicon semiconductor layer 105 may be made of polycrystalline silicon, single crystalline silicon, amorphous silicon, or the like. In the case where the silicon semiconductor layer 105 is made of polycrystalline silicon, the polycrystalline silicon may be formed by crystallizing amorphous silicon using a crystallization method, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like.

The silicon semiconductor layer 105 may include a channel region 105c which is arranged to overlap a first gate electrode 111 thereabove in the thickness direction thereof, and a first source/drain region 105a and a second source/drain region 105b, which are respectively located on one side and the other side of the channel region 105c. The first and second source/drain regions 105a and 105b of the silicon semiconductor layer 105 may include a plurality of carrier ions and thus may have higher conductivity and lower electrical resistance than the channel region 105c.

The silicon semiconductor layer 105 may be a semiconductor layer of each of the first transistor T1, the second transistor T2, the fifth transistor T5, and the sixth transistor T6, which are described above, and may form a channel of the corresponding transistor.

The first gate insulating film GI1 may be located on the silicon semiconductor layer 105. The first gate insulating film GI1 may cover an upper surface of the silicon semiconductor layer 105 except for portions in which contact holes CNT1 and CNT2 are formed and also cover side surfaces of the silicon semiconductor layer 105. The first gate insulating film GI1 may be formed to cover the entirety of (or the majority of) the surface of the base substrate 101.

The first gate insulating film GI1 may include a silicon compound, a metal oxide, or the like. For example, the first gate insulating film GI1 may include silicon oxide, silicon nitride, silicon oxynitride, aluminum oxide, tantalum oxide, hafnium oxide, zirconium oxide, titanium oxide, or the like. The above materials may be used alone or in combinations thereof. The first gate insulating film GI1 may be a single film or a multilayered film formed as a stacked film of different materials.

The first conductive layer 110 is located on the first gate insulating film GI1. The first conductive layer 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be a single film or a multilayered film.

The first conductive layer 110 may be a gate conductive layer and may include the first gate electrode 111 located in the silicon transistor region AR1. The first gate electrode 111 may be a gate electrode of the silicon transistor. The first gate electrode 111 may be connected to the first electrode of the capacitor Cst. The first electrode of the capacitor Cst may be formed using the first gate electrode 111 itself or may be formed using a portion extending from the first gate electrode 111. For example, a portion of a pattern of the integrated first conductive layer may overlap the silicon semiconductor layer 105 to function as the first gate electrode 111 at the corresponding portion, and the other portion of the pattern may not overlap the silicon semiconductor layer 105 to function as the first electrode of the capacitor Cst which overlaps a second electrode 121 of the capacitor Cst thereabove.

The second gate insulating film GI2 may be located on the first conductive layer 110. The second gate insulating film GI2 may cover an upper surface of the first gate electrode 111 except for portions in which the contact holes CNT1 and CNT2 are formed and also cover side surfaces of the first gate electrode 111. The second gate insulating film GI2 may be formed to cover the entirety of (or the majority of) the surface of the first gate insulating film GI1.

The second gate insulating film GI2 may include a silicon compound, a metal oxide, or the like. For example, the second gate insulating film GI2 may include silicon oxide, silicon nitride, silicon oxynitride, aluminum oxide, tantalum oxide, hafnium oxide, zirconium oxide, titanium oxide, or the like. The above materials may be used alone or in combinations thereof. The second gate insulating film GI2 may be a single film or a multilayered film formed as a stacked film of different materials.

The second conductive layer 120 is located on the second gate insulating film GI2. The second conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 120 may be a single film or a multilayered film.

The second conductive layer 120 may be a conductive layer of the capacitor Cst and may include the second electrode 121 of the capacitor Cst located in the silicon transistor region AR1. The second electrode 121 of the capacitor Cst and the first electrode of the capacitor Cst connected to the first gate electrode 111 therebelow may form the capacitor Cst with the second gate insulating film GI2 interposed therebetween.

The first interlayer insulating film ILD1 is located on the second conductive layer 120. The first interlayer insulating film ILD1 may include a silicon compound, a metal oxide, or the like. For example, the first interlayer insulating film ILD1 may include silicon oxide, silicon nitride, silicon oxynitride, aluminum oxide, tantalum oxide, hafnium oxide, zirconium oxide, titanium oxide, or the like. The above materials may be used alone or in combinations thereof. The first interlayer insulating film ILD1 may be a single film or a multilayered film formed as a stacked film of different materials.

The oxide semiconductor layer 135 is located on the first interlayer insulating film ILD1. The oxide semiconductor layer 135 is located in the oxide transistor region AR2. The oxide semiconductor layer 135 may include an oxide semiconductor. The oxide semiconductor may include one or more oxides selected from gallium indium zinc oxide (GIZO), zinc (Zn), indium (In), gallium (Ga), tin (Sn) cadmium (Cd), germanium (Ge), hafnium (Hf), and a combination thereof. The oxide semiconductor may include at least one of indium gallium zinc oxide (IGZO), zinc tin oxide (ZTO), indium tin oxide (IZO), and the like.

The oxide semiconductor layer 135 may include the channel region 135c arranged to overlap the third gate electrode 142 thereabove in the thickness direction thereof and a first source/drain region 135a and a second source/drain region 135b of the oxide semiconductor layer 135 which are respectively located on one side and the other side of the channel region 135c. The first and second source/drain regions 135a and 135b of the oxide semiconductor layer 135 may be conductive regions and may have higher conductivity and lower electrical resistance than the channel region 135c.

The oxide semiconductor layer 135 may be a semiconductor layer of each of the third transistor T3, the fourth transistor T4, and the seventh transistor T7, which are described above, and may form a channel of the corresponding transistor.

The third gate insulating film GI3 is located on the oxide semiconductor layer 135. The third gate insulating film GI3 may be located only in a partial region unlike the first gate insulating film GI1 and the second gate insulating film GI2. That is, the third gate insulating film GI3 may cover the channel region 135c of the oxide semiconductor layer 135 to expose side surfaces of the first and second source/drain regions 135a and 135b and the oxide semiconductor layer 135. The third gate insulating film GI3 may have a pattern shape substantially the same as that of a third gate electrode 142 thereabove.

The third gate insulating film GI3 may include a silicon compound, a metal oxide, or the like. For example, the third gate insulating film GI3 may include silicon oxide, silicon nitride, silicon oxynitride, aluminum oxide, tantalum oxide, hafnium oxide, zirconium oxide, titanium oxide, or the like. The above materials may be used alone or in combinations thereof. The third gate insulating film GI3 may be a single film or a multilayered film formed as a stacked film of different materials.

The third conductive layer 140 is located on the third gate insulating film GI3. The third conductive layer 140 may be a gate conductive layer and may include the third gate electrode 142 of the transistor located in the oxide transistor region AR2. The third conductive layer 140 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 140 may be a single film or a multilayered film.

The second interlayer insulating film ILD2 is located on the third conductive layer 140. The second interlayer insulating film ILD2 may include a silicon compound, a metal oxide, or the like. For example, the second interlayer insulating film ILD2 may include silicon oxide, silicon nitride, silicon oxynitride, aluminum oxide, tantalum oxide, hafnium oxide, zirconium oxide, titanium oxide, or the like. The above materials may be used alone or in combinations thereof. The second interlayer insulating film ILD2 may be a single film or a multilayered film formed as a stacked film of different materials.

The fourth conductive layer 150 is located on the second interlayer insulating film ILD2. The fourth conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 150 may be a single film or a multilayered film.

The fourth conductive layer 150 may be a data conductive layer and may include a first source/drain electrode 151 and a second source/drain electrode 152 of the transistor located in the silicon transistor region AR1 and a first source/drain electrode 153 and a second source/drain electrode 154 of the transistor located in the oxide transistor region AR2.

In the transistor located in the silicon transistor region AR1, the first source/drain electrode 151 may be connected to the first source/drain region 105a of the silicon semiconductor layer 105 through a first contact hole CNT1 which passes through the second interlayer insulating film ILD2, the second gate insulating film GI2, and the first gate insulating film GI1 and exposes the first source/drain region 105a of the silicon semiconductor layer 105. The second source/drain electrode 152 may be connected to the second source/drain region 105b of the silicon semiconductor layer 105 through a second contact hole CNT2 which passes through the second interlayer insulating film ILD2, the second gate insulating film GI2, and the first gate insulating film GI1 and exposes the second source/drain region 105b of the silicon semiconductor layer 105.

In the transistor located in the oxide transistor region AR2, the first source/drain electrode 153 may be connected to the first source/drain region 135a of the oxide semiconductor layer 135 through a third contact hole CNT3 which passes through the second interlayer insulating film ILD2 and exposes the first source/drain region 135a of the oxide semiconductor layer 135. The second source/drain electrode 154 may be connected to the second source/drain region 135b of the oxide semiconductor layer 135 through a fourth contact hole CNT4 which passes through the second interlayer insulating film ILD2 and exposes the second source/drain region 135b of the oxide semiconductor layer 135.

The first via layer VIA1 is located on the fourth conductive layer 150. The first via layer VIA1 may include an inorganic insulating material or an organic insulating material such as polyacrylate resin, epoxy resin, phenolic resin, polyamide resin, polyimide resin, unsaturated polyester resin, polyphenylene ether resin, polyphenylene sulfide resin, benzocyclobutene (BCB), or the like. The first via layer VIA1 may be a single film or a multilayered film formed as a stacked film of different materials.

The via layer VIA1 may be arranged above the second interlayer insulating film ILD2 to fully cover an upper surface of the second interlayer insulating film ILD2. When the first via layer VIA1 is formed of an organic film, an upper surface of the first via layer VIA1 may be flat despite a step therebelow.

The fifth conductive layer 160 is located on the first via layer VIA1. The fifth conductive layer 160 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fifth conductive layer 160 may be a single film or a multilayered film.

The fifth conductive layer 160 may include a connection electrode 161. A fifth contact hole CNT5 which exposes the second source/drain electrode 152 of the transistor located in the silicon transistor region AR1 may be located on the first via layer VIA1, and the connection electrode 161 may be connected to the second source/drain electrode 152 through the fifth contact hole CNT5.

The second via layer VIA2 is located on the connection electrode 161. The second via layer VIA2 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, or the like. The second via layer VIA2 may be a single film or a multilayered film formed as a stacked film of different materials.

The anode electrode ANO is located on the second via layer VIA2. The anode electrode ANO may be an anode electrode. The anode electrode ANO may be arranged separately for each pixel. The anode electrode ANO may be electrically connected to the connection electrode 161 through the sixth contact hole CNT6 which passes through the second via layer VIA2 and exposes a portion of the connection electrode 161.

Embodiments according to the present disclosure are not limited thereto, and according to some example embodiments, the anode electrode ANO may have a stacked film structure in which a material layer having a high work function such as indium tin oxide (ITO), indium zinc oxide (IZO), zinc oxide (ZnO), or indium oxide (In$_2$O$_3$) and a reflective material layer, such as silver (Ag), magnesium (Mg), aluminum (Al), platinum (Pt), lead (Pb), gold (Au), nickel (Ni), neodium (Nd), iridium (Ir), chromium (Cr), or a mixture thereof are stacked. A layer having a high work function may be arranged above the reflective material layer and located close to a light-emitting layer EL. The anode electrode ANO may have a multilayer structure of ITO/Mg, ITO/MgF, ITO/Ag, and ITO/Ag/ITO, but embodiments according to the present disclosure are not limited thereto.

The pixel definition film PDL may be located on the anode electrode ANO. The pixel definition film PDL may include an opening which partially exposes the anode electrode ANO. The pixel definition film PDL may be made of an organic insulating material or an inorganic insulating material. For example, the pixel definition film PDL may include at least one of a polyimide resin, an acrylic resin, a silicone compound, a polyacrylic resin, and the like.

The light-emitting layer EL is located on the anode electrode ANO exposed by the pixel definition film PDL. The light-emitting layer EL may include an organic material layer. The organic material layer of the light-emitting layer may include an organic light-emitting layer and may further include a hole injection/transport layer and/or an electron injection/transport layer.

A cathode electrode CAT may be located on the light-emitting layer EL. The cathode electrode CAT may be a common electrode formed over an entirety of the pixels PX without distinguishing the pixels PX. Each of the anode electrode ANO, the light-emitting layer EL, and the cathode electrode CAT may form an organic light-emitting element.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba, a compound thereof, or a mixture (e.g., a mixture of Ag and Mg, etc.) thereof. The cathode electrode CAT may further include a transparent metal oxide layer located on the material layer having the low work function.

The anode electrode ANO, the light-emitting layer EL, and the cathode electrode CAT may constitute an organic light-emitting element.

A thin film encapsulation layer 170 including a first inorganic film 171, a first organic film 172, and a second inorganic film 173 is located above the cathode electrode CAT. The first inorganic film 171 and the second inorganic film 173 may be in contact with each other at an end portion of the thin film encapsulation layer 170. The first organic film 172 may be sealed by the first inorganic film 171 and the second inorganic film 173.

Each of the first inorganic film 171 and the second inorganic film 173 may include silicon nitride, silicon oxide, silicon oxynitride, or the like. The first organic film 172 may include an organic insulating material.

Hereinafter, further details of a non-display region NDA will be described.

In the non-display region NDA of the display panel 100, the base substrate 101, the barrier layer 102, the buffer layer 103, the first gate insulating film GI1, the second gate insulating film GI2, the first interlayer insulating film ILD1, the second interlayer insulating film ILD2, the first via layer VIA1, a connection line 165 formed of the fifth conductive layer 160, the second via layer VIA2, and the pixel definition film PDL may be sequentially arranged.

The non-display region NDA may include a bending region BA. The bending region BA may include openings OP1 and OP2 which are formed by partially removing one or more insulating films to expose the base substrate 101. For example, the openings OP1 and OP2 may be formed by partially removing one or more insulating films in a portion in which the barrier layer 102, the buffer layer 103, the first gate insulating film GI1, the second gate insulating film GI2, the first interlayer insulating film ILD1, and the second interlayer insulating film ILD2 overlap each other. Each of the openings OP1 and OP2 may be defined by sidewalls of the insulating films being partially removed. Further details thereof will be described below.

The openings of the bending region BA may include a bending opening OP2 and a bending peripheral opening OP1.

As illustrated in FIG. 1, the bending opening OP2 is formed to cross the bending region BA in a width direction thereof, that is, in the first direction DR1. The bending peripheral opening OP1 is located around the bending opening OP2. A width (a width in the second direction DR2) of the bending peripheral opening OP1 may be greater than a width (a width in the second direction DR2) of the bending opening OP2. Due to the formation of the bending opening OP2, bending stress that may occur when the above-described display device 1 is bent in the bending region BA may be prevented.

In the plan view, the bending opening OP2 may be located in the bending peripheral opening OP1. One sidewall of the bending peripheral opening OP1 may be located on one side of the bending opening OP2 in the second direction DR2 and the other sidewall of the bending peripheral opening OP1 may be located on the other side of the bending opening OP2 in the second direction DR2.

The bending peripheral opening OP1 is formed to pass through the first interlayer insulating film ILD1, the second gate insulating film GI2, and the first gate insulating film GI1. A first sidewall SW1 of the bending peripheral opening OP1 may be formed of the first interlayer insulating film ILD1, the second gate insulating film GI2, and the first gate insulating film GI1. The first sidewall SW1 may be an etched surface formed by etching. Side surfaces of the first interlayer insulating film ILD1, the second gate insulating film GI2, and the first gate insulating film GI1 which form the first sidewall SW1 may be arranged with each other. The bending peripheral opening OP1 may expose the buffer layer 103 therebelow. The buffer layer 103 and the barrier layer 102 therebelow may protrude from the first sidewall SW1 of the bending peripheral opening OP1 to the bending opening OP2. The first sidewall SW1 of the bending peripheral opening OP1 may be covered by the second interlayer insulating film ILD2 thereabove. That is, the second interlayer insulating film ILD2 may be in direct contact with a side surface of the first interlayer insulating film ILD1, a side surface of the second gate insulating film GI2, and a side surface of the first gate insulating film GI1, which form the first sidewall SW1 of the bending peripheral opening OP1, and furthermore, may be in direct contact with an upper surface of the buffer layer 103, which protrudes from a lower portion of the first gate insulating film GI1 to the bending opening OP2.

The bending opening OP2 is formed in the bending peripheral opening OP1 to pass through the second interlayer insulating film ILD2 which is located on the buffer layer 103 exposed through the bending peripheral opening OP1, the buffer layer 103, and the barrier layer 102. The bending opening OP2 may include a second sidewall SW2, a third sidewall SW3 located above an upper portion of the second sidewall SW2, and a stepped portion GP located between the second sidewall SW2 and the third sidewall SW3. The second sidewall SW2, the third sidewall SW3, and the stepped portion GP may be located at an inner side of the first sidewall SW1 of the bending peripheral opening OP1 described above.

The second sidewall SW2 of the bending opening OP2 may be formed of a side surface of the barrier layer 102, a side surface of the buffer layer 103, and a portion of a side surface of the second interlayer insulating film ILD2. The side surface of the barrier layer 102, the side surface of the buffer layer 103, and the portion of the side surface of the second interlayer insulating film ILD2 may be arranged with each other. The second sidewall SW2 may be an etched surface formed by etching.

The third sidewall SW3 of the bending opening OP2 may be formed of another portion of the side surface of the second interlayer insulating film ILD2. The third sidewall SW3 may be formed by being conformally formed along the first sidewall SW1 of the bending peripheral opening OP1 in which the second interlayer insulating film ILD2 is located below the first sidewall SW1. Unlike the first sidewall SW1 or the second sidewall SW2, the third sidewall SW3 may be an unetched surface formed by conformal deposition without etching.

The stepped portion GP formed of the upper surface of the second interlayer insulating film ILD2 may be located between the second sidewall SW2 and the third sidewall SW3 the bending opening OP2. The stepped portion GP may overlap the buffer layer 103 and the barrier layer 102 which protrude from the first sidewall SW1 of the bending peripheral opening OP1 to the bending opening OP2. An upper surface of the stepped portion GP may be flat, but embodiments according to the present disclosure are not limited thereto.

A length d1 of the second sidewall SW2 located on the other side of the bending opening OP2 in the second direction DR2, which protrudes from the first sidewall SW1 located on the other side of the bending peripheral opening OP1 in the second direction DR2, may be different from a length d2 of the second sidewall SW2 located on one side of the bending opening OP2 in the second direction DR2, which protrudes from the first sidewall SW1 located on one side of the bending peripheral opening OP1 in the second direction DR2.

The second sidewall SW2 of the bending opening OP2 may protrude further from the first sidewall SW1 of the bending peripheral opening OP1 than the third sidewall SW3. That is, in the bending region BA, a distance between the second sidewall SW2 located on one side and the second sidewall SW2 located on the other side may be smaller than a distance between the third sidewall SW3 located on one side and the third sidewall SW3 located on the other side, and the distance between the second sidewalls SW2 and the distance between the third sidewalls SW3 may be smaller than a distance between the first sidewalls SW1 of the bending peripheral opening OP1.

A space which is empty due to the bending opening OP2 is filled with the first via layer VIA1. The first via layer VIA1 covers an upper surface of the base substrate 101 exposed through the bending opening OP2. Furthermore, the first via layer VIA1 may be in contact with the second sidewall SW2, the third sidewall SW3, and the stepped portion GP, which are inner side surfaces of the bending opening OP2. As described above, the first via layer VIA1 may be located above the second interlayer insulating film ILD2 to fully cover the upper surface of the second interlayer insulating film ILD2. When the first via layer VIA1 is formed of an organic film, the upper surface of the first via layer VIA1 may be flat despite a step therebelow.

The connection line 165 is located on the upper surface of the first via layer VIA1. The connection line 165 may be formed of the fifth conductive layer 160. The connection line 165 may be formed together with the connection electrode 161 described above and may be made of the same material as the material forming the connection electrode 161.

The second via layer VIA2 and the pixel definition film PDL may be located on the connection line 165. In the non-display region NDA, at least one of the second via layer VIA2 or the pixel definition film PDL may be omitted.

Hereinafter, a method of manufacturing a display device according to some example embodiments will be described in more detail.

Figure 5:
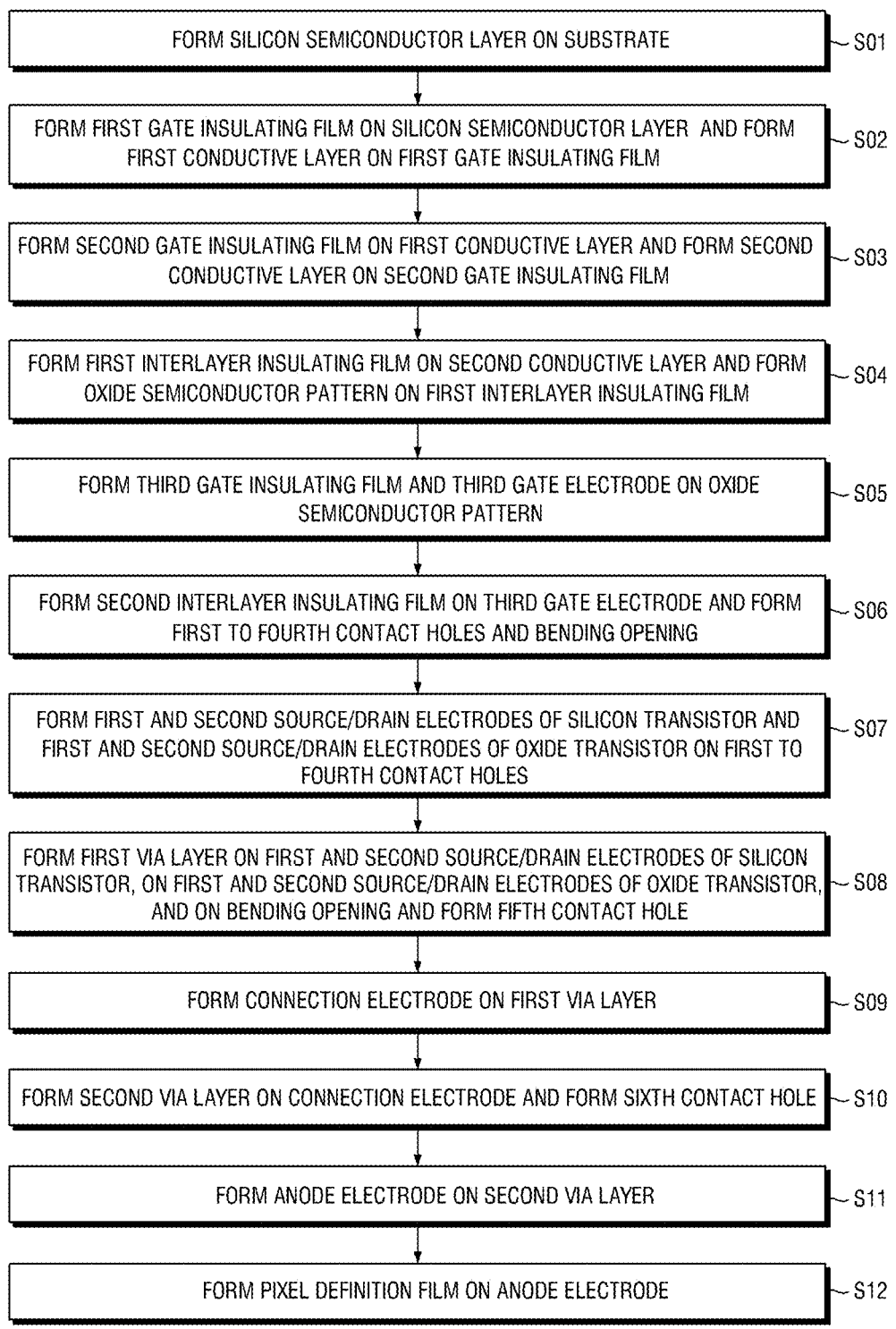
FIG. 5 is a flowchart illustrating a method of manufacturing a display device according to some example embodiments.

FIG. 5 is a flowchart illustrating a method of manufacturing a display device according to some example embodiments.

Figure 6:
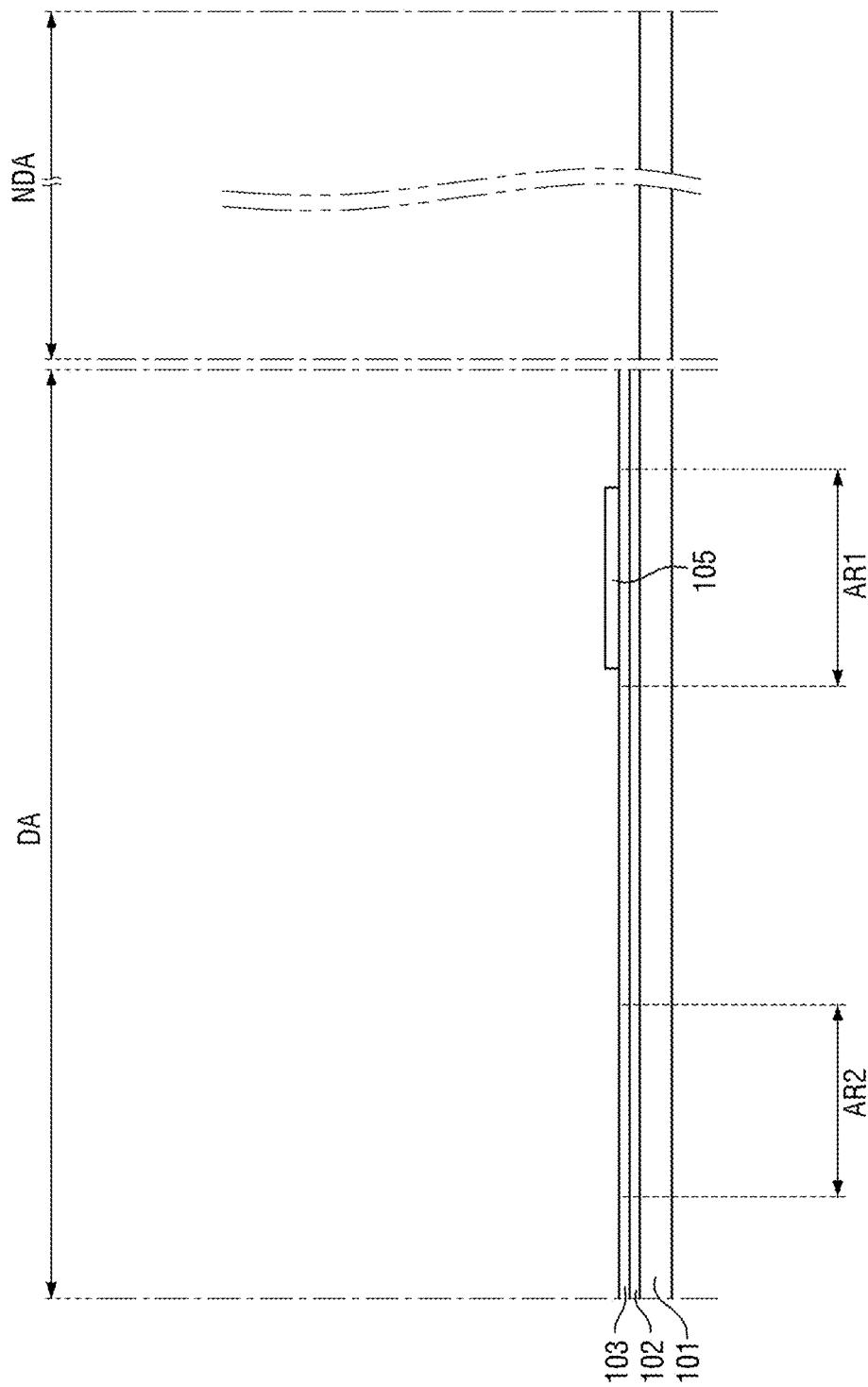
FIGS. 6 to 8 are cross-sectional views illustrating process operations before a process operation of forming an oxide semiconductor pattern in a method of manufacturing a display device according to some example embodiments.
Figure 7:
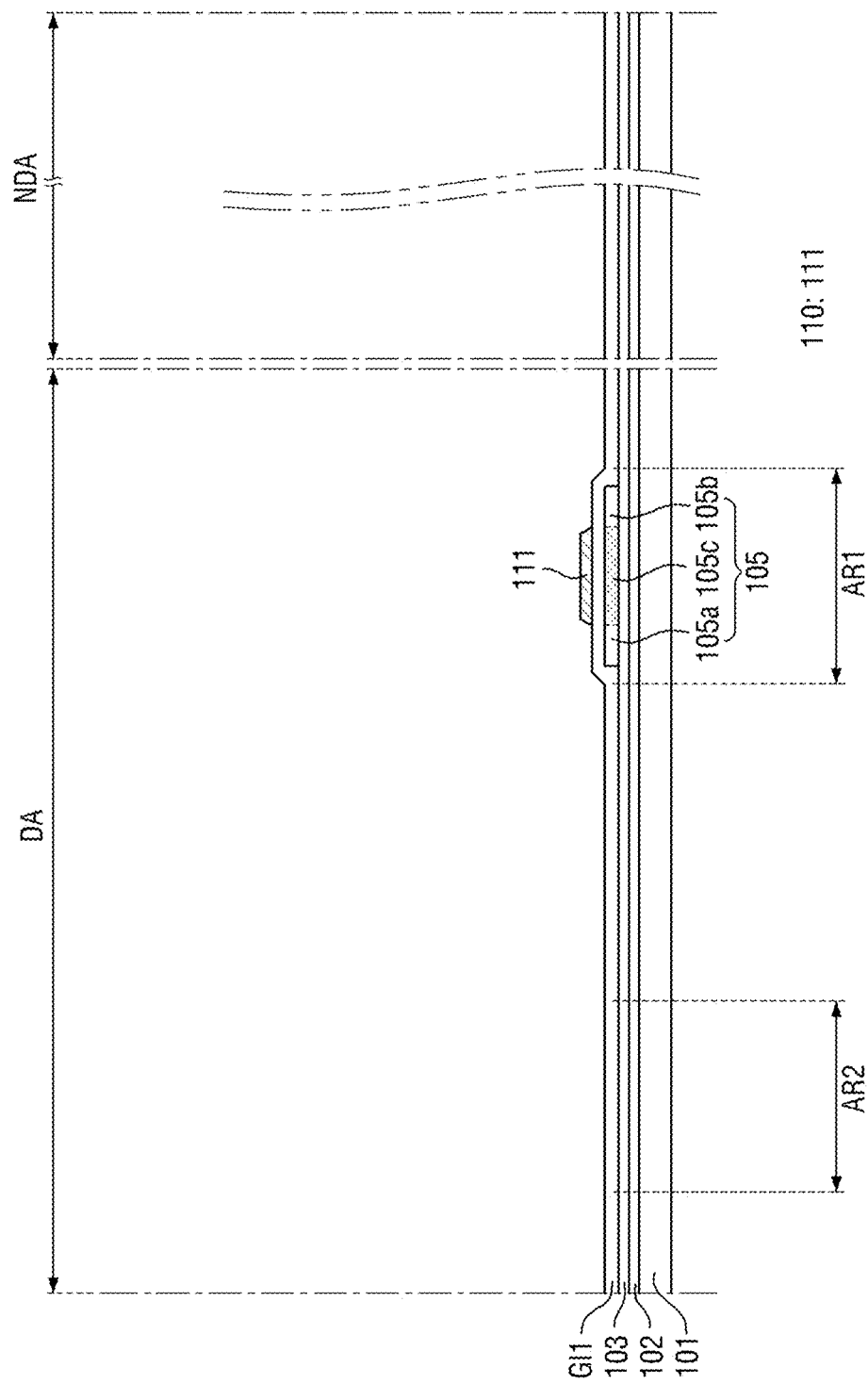
Figure 8:
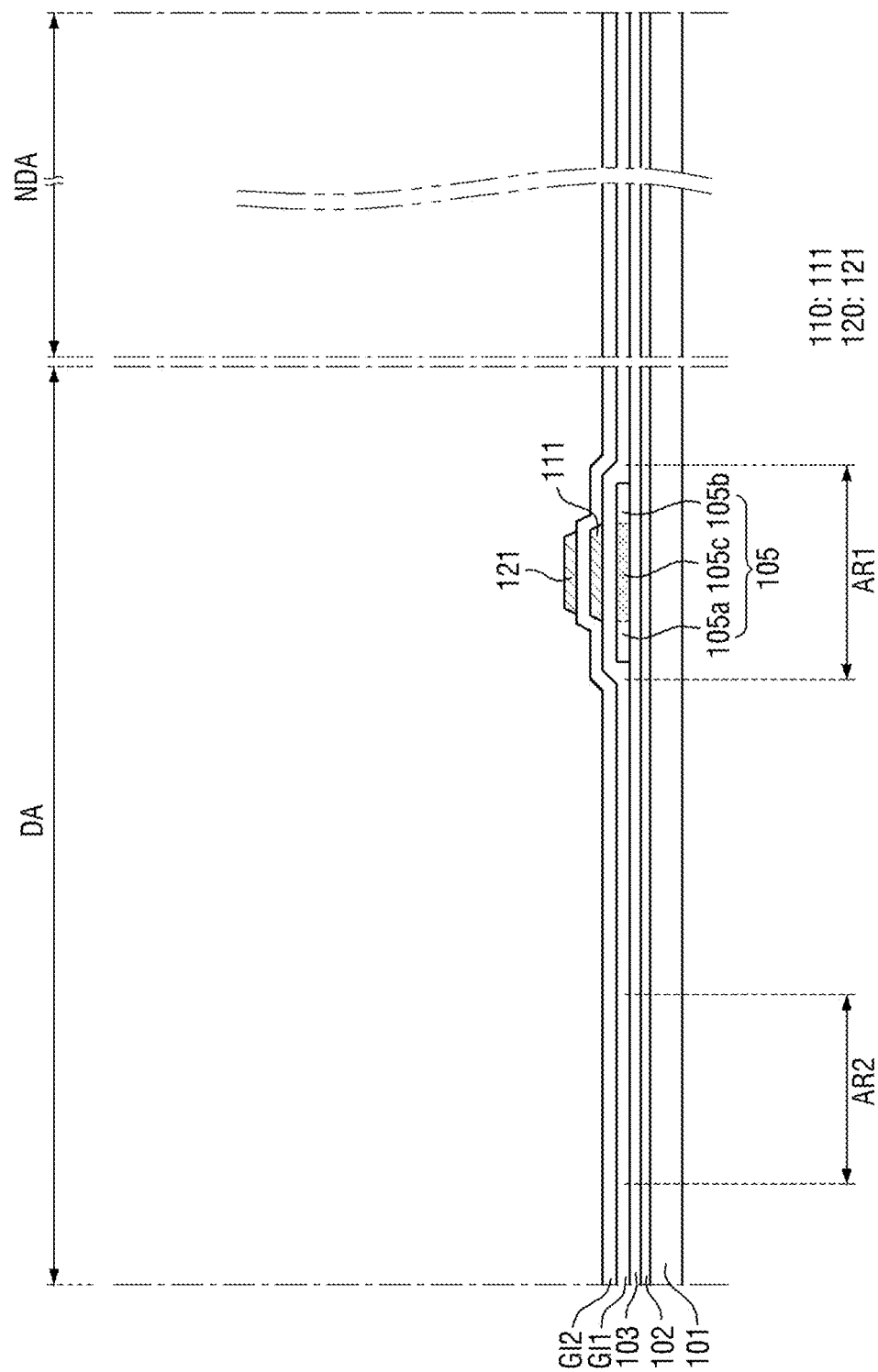

FIGS. 6 to 8 are cross-sectional views illustrating process operations before a process operation of forming an oxide semiconductor pattern in the method of manufacturing a display device according to some example embodiments.

Referring to FIGS. 5 and 6, first, a display region DA including a silicon transistor region AR1 and an oxide transistor region AR2 and a non-display region NDA arranged around the display region DA are defined, a base substrate 101 on which a silicon semiconductor layer 105 is located is provided in the silicon transistor region AR1, and the silicon semiconductor layer 105 is formed (S01).

For example, a barrier layer 102 and a buffer layer 103 may be sequentially stacked on the base substrate 101, and a silicon semiconductor layer may be formed on the buffer layer 103 and then patterned by a photolithography process so that the silicon semiconductor layer 105 may be formed as illustrated in FIG. 6.

Subsequently, referring to FIG. 7, a first gate insulating film GI1 is formed on the silicon semiconductor layer 105, and a first conductive layer 110 including a first gate electrode 111 is formed on the first gate insulating film GI1 (S02).

For example, the first gate insulating film GI1 may be formed on an entire surface of the buffer layer 103 on which the silicon semiconductor layer 105 is formed. Subsequently, the first gate electrode 111 is formed on the first gate insulating film GI1. That is, a material layer for a first conductive layer may be deposited on an entire surface of the first gate insulating film GI1 and then patterned by a photolithography process so that the first gate electrode 111 may be formed as illustrated in FIG. 7.

Subsequently, referring to FIG. 8, a second gate insulating film GI2 is formed on the first gate electrode 111, and a second electrode 121 of a capacitor Cst is formed on the second gate insulating film GI2 (S03).

For example, the second gate insulating film GI2 may be formed on an entire surface of the first gate insulating film GI2 on which the first gate electrode 111 is formed. Subsequently, the second electrode 121 of the capacitor Cst is formed on the second gate insulating film GI2. That is, a material layer for a second conductive layer may be deposited on an entire surface of the second gate insulating film GI2 and then patterned by a photolithography process so that the second electrode 121 of the capacitor Cst may be formed as illustrated in FIG. 8.

Figure 9:
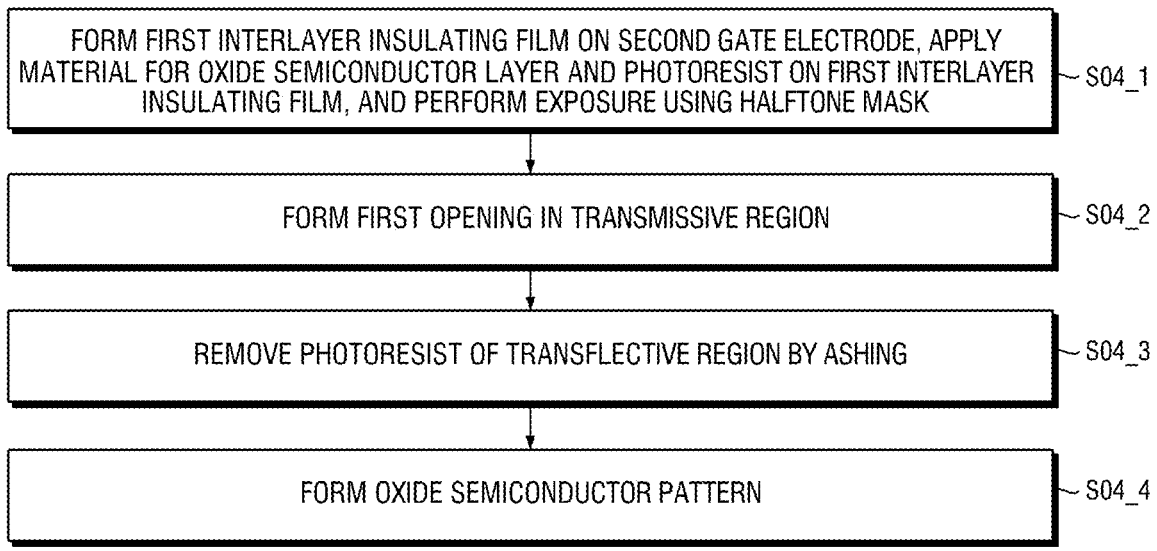
FIG. 9 is a flowchart illustrating process operations of a process of forming an oxide semiconductor pattern according to some example embodiments.

FIG. 9 is a flowchart illustrating process operations of a process of forming an oxide semiconductor pattern according to some example embodiments.

FIGS. 10 to 14 are cross-sectional views illustrating process operations of the process of forming the oxide semiconductor pattern in the method of manufacturing a display device according to some example embodiments.

Hereinafter, an operation S04 of forming an oxide semiconductor layer 135 will be described in detail with reference to FIGS. 9 to 14.

Figure 10:
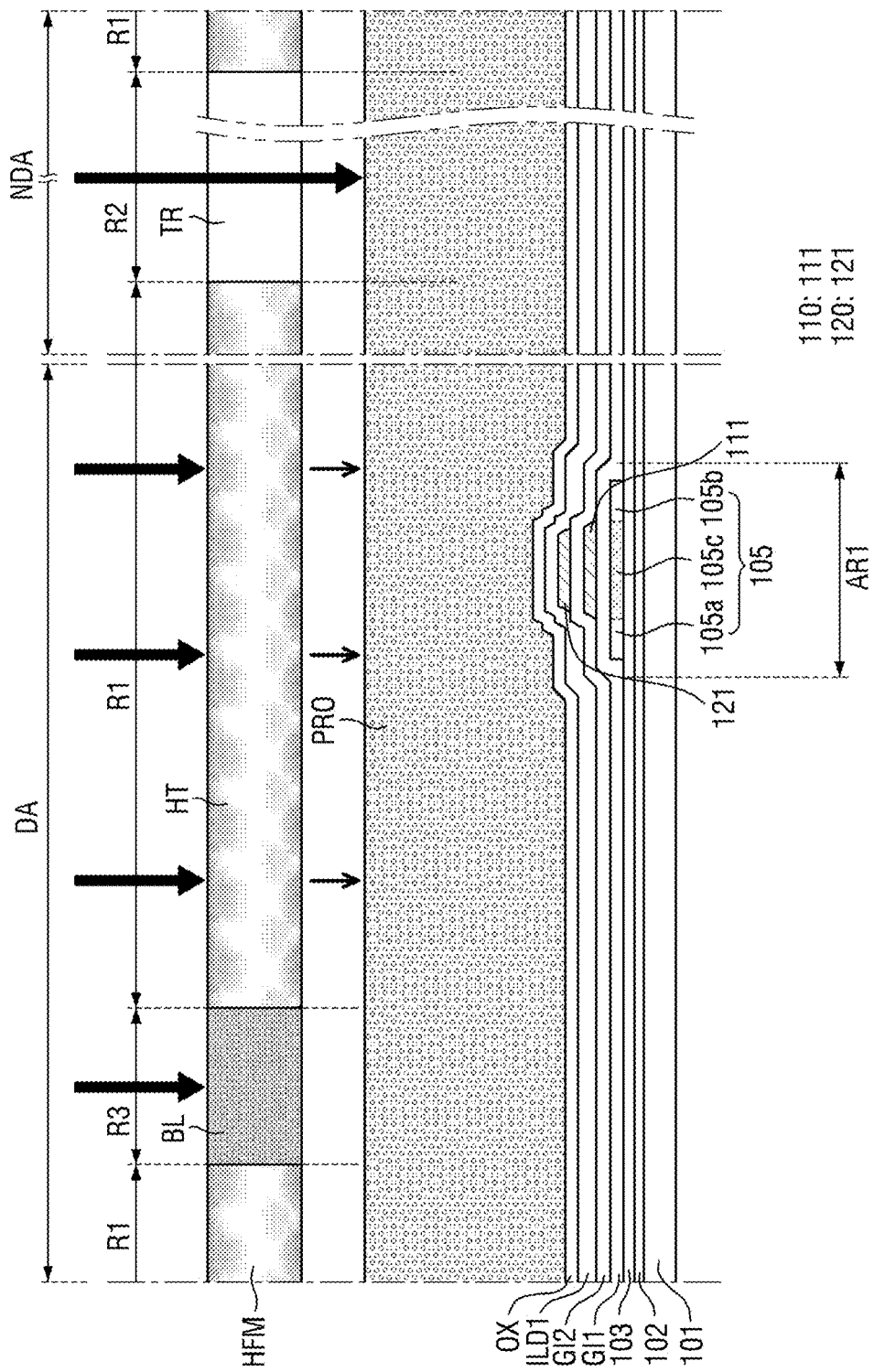
FIGS. 10 to 14 are cross-sectional views illustrating process operations of a process of forming an oxide semiconductor pattern in a method of manufacturing a display device according to some example embodiments.
Figure 11:
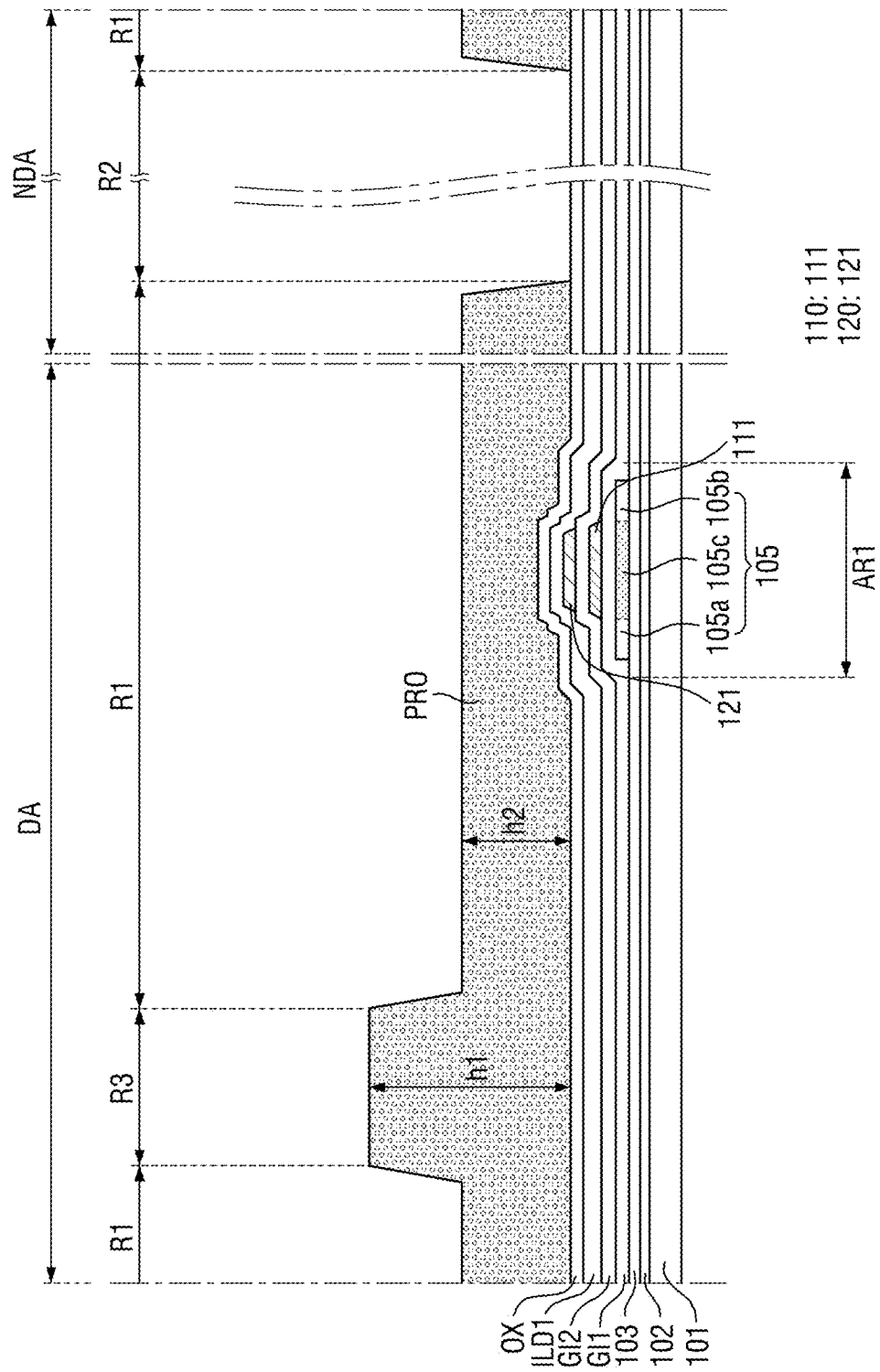

Referring to FIGS. 9 to 11, a first interlayer insulating film ILD1 is formed on the second electrode 121 of the capacitor Cst, a material OX for an oxide semiconductor layer and a photoresist PRO for an oxide semiconductor layer are applied on the first interlayer insulating film ILD1 and then exposure is performed using a halftone mask HFM (S04_1).

For example, the material OX for the oxide semiconductor layer and the photoresist PRO for the oxide semiconductor layer may be applied on the first interlayer insulating film ILD1 and then exposure may be performed using the halftone mask HFM so that a photoresist pattern may be formed.

The halftone mask HFM may be divided into a light blocking portion BL, a first light transmission portion HT, and a second light transmission portion HR according to transmittance (or light transmittance) in one mask. A light transmittance of the second light transmission portion HR may be greater than that of the first light transmission portion HT.

The photoresist PRO for the oxide semiconductor layer may be divided into a first region R1, a second region R2, and a third region R3. The first region R1 may correspond to the first light transmission portion HT of the halftone mask HFM, and the second region R2 may correspond to the second light transmission portion HR of the halftone mask HFM. Further, the third region R3 may correspond to the light blocking portion BL of the halftone mask HFM.

The light blocking portion BL may block light provided from the outside to prevent the light from reaching the third region R3 of the photoresist PRO for the oxide semiconductor layer. The first light transmission portion HT may transmit only some of the light provided from the outside by controlling the light transmittance and allow only some of the light to reach the first region R1 of the photoresist PRO for the oxide semiconductor layer. The second light transmission portion HR may transmit most of the light provided from the outside and allow most of the light to reach the second region R2 of the photoresist PRO for the oxide semiconductor layer.

For example, in the case of a positive photoresist, a photosensitizer is decomposed in the exposed photoresist and an acid is formed. As a result, a region in which the photosensitizer is decomposed has a property of melting well in developer. In this case, any one portion of the photoresist of the substrate may be selectively removed according to a chemical change of a portion which is exposed to light and a portion which is not exposed to the light using a developer (e.g., a set or predetermined developer), thereby forming a photoresist pattern. However, in the case where the halftone mask HFM is used, only a portion of the photoresist may be removed from a portion (e.g., the second region R2) corresponding to a portion (e.g., the first light transmission portion HT) which partially transmits only some of light provided from the outside, and the remaining portion thereof may remain unremoved. Therefore, the photoresist PRO for the oxide semiconductor layer of the third region R3 may remain to a first height h1, and the photoresist PRO for the oxide semiconductor layer of the first region R1 may remain to a second height h2. The first height h1 may be greater than the second height h2. Further, the photoresist of the second region R2 may be fully removed and a portion of an upper surface of the material OX for the oxide semiconductor layer may be exposed in the second region R2. However, in the case of a negative photoresist, whether the photoresist PRO for the oxide semiconductor layer remains in the third region R3 may be opposite to whether the photoresist PRO for the oxide semiconductor layer remains in the first region R1.

Figure 12:
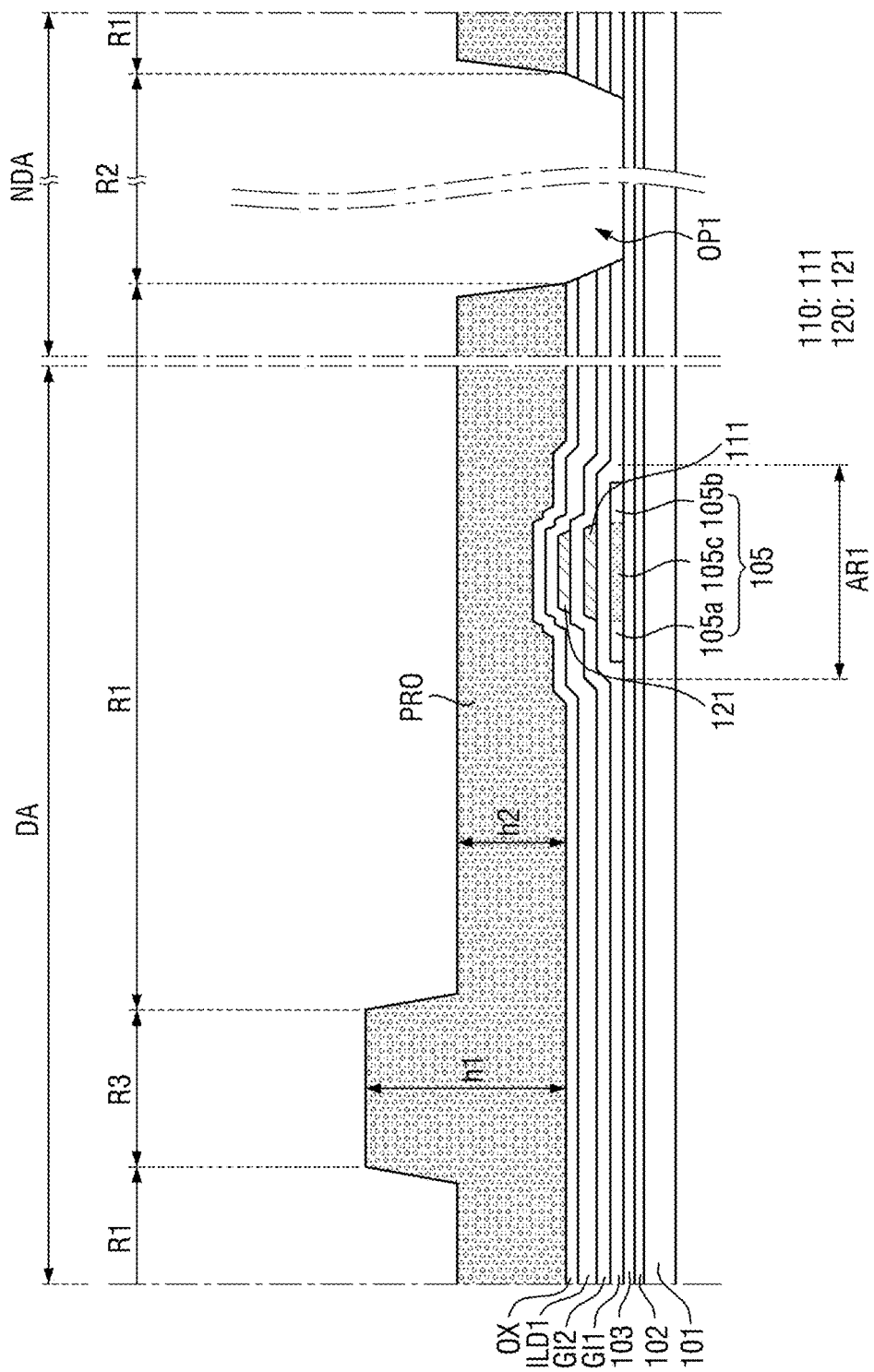

Subsequently, referring to FIG. 12, in the second region R2 in which the photoresist PRO for the oxide semiconductor layer is fully removed, the material OX for the oxide semiconductor layer, the first interlayer insulating film ILD, the second gate insulating film GI2, and the first gate insulating film GI1 are etched so that a bending peripheral opening OP1 is formed (S04_2).

For example, in the second region R2 in which the photoresist PRO for the oxide semiconductor layer is fully removed, the material OX for the oxide semiconductor layer may be etched using a wet etching method and then the first interlayer insulating film ILD, the second gate insulating film GI2, and the first gate insulating film GI1 may be etched using a dry etching method so that the bending peripheral opening OP1 is formed. In the etching process for forming the bending peripheral opening OP1, the exposed buffer layer 103 may be further etched after the first gate insulating film GI1 is etched. In this case, sidewalls of the bending peripheral opening OP1 may be formed of a portion of the buffer layer 103 as well as the first interlayer insulating film ILD, the second gate insulating film GI2, and the first gate insulating film GI1.

Figure 13:
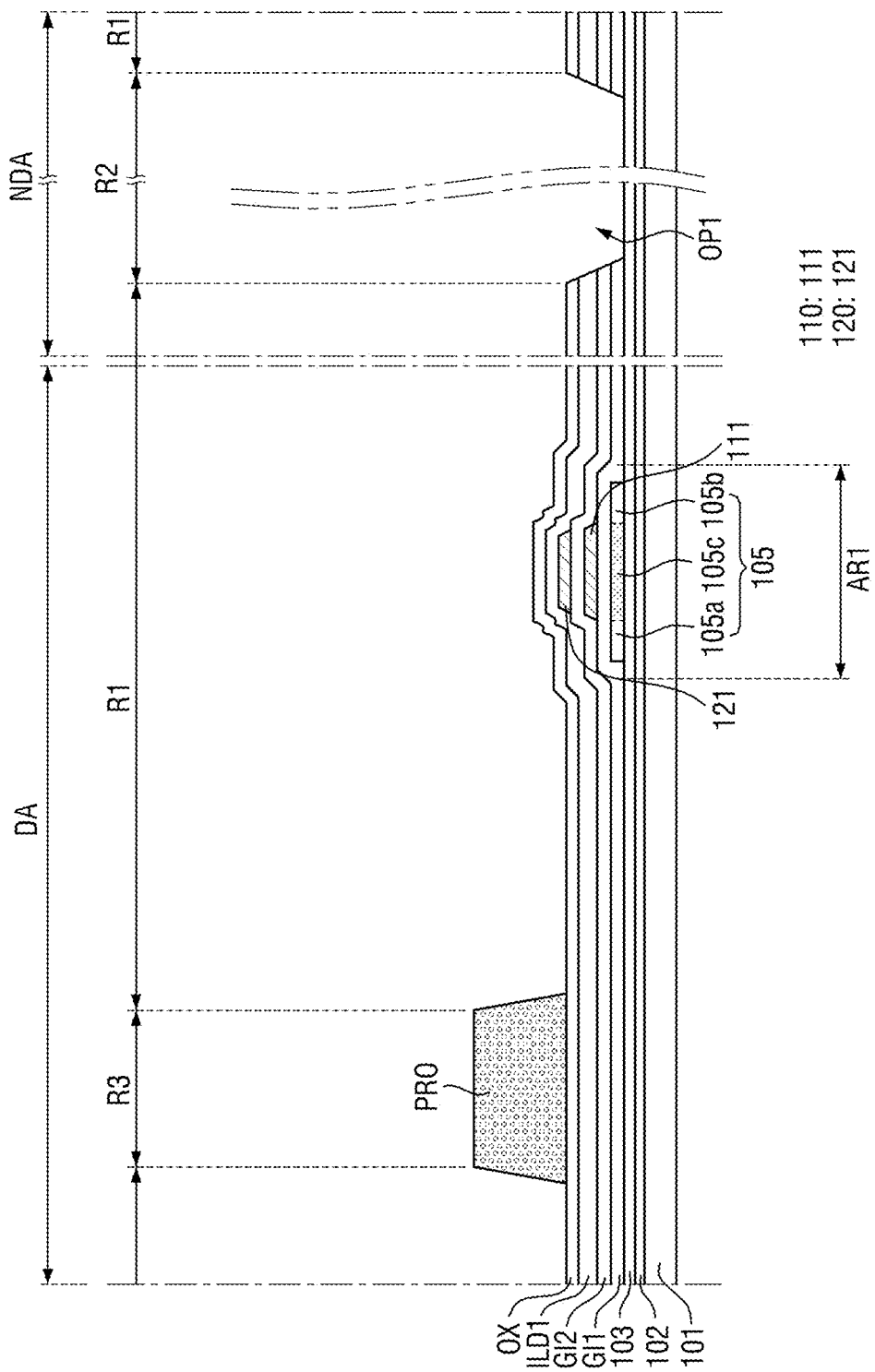
Figure 14:
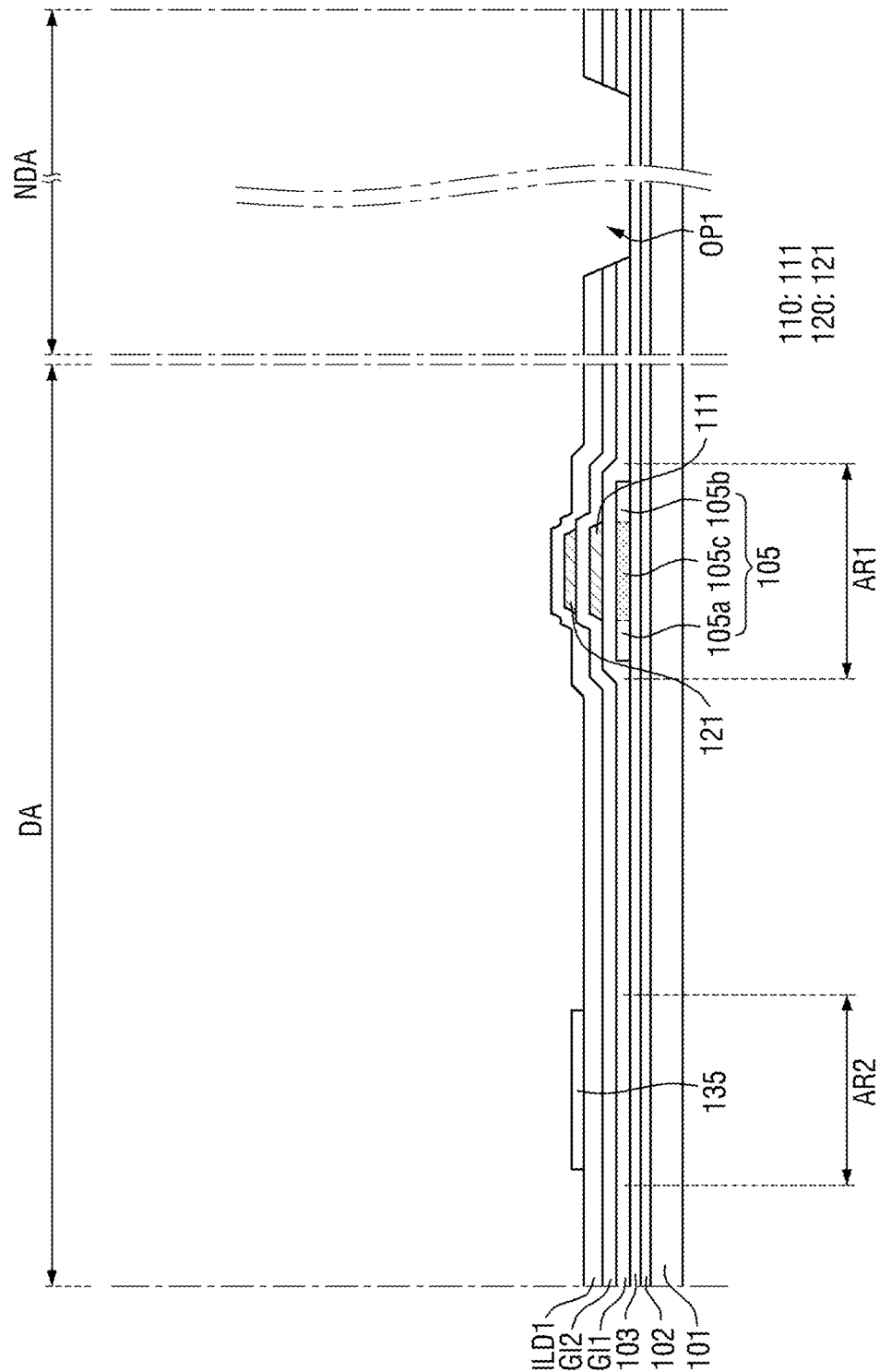
Figure 15:
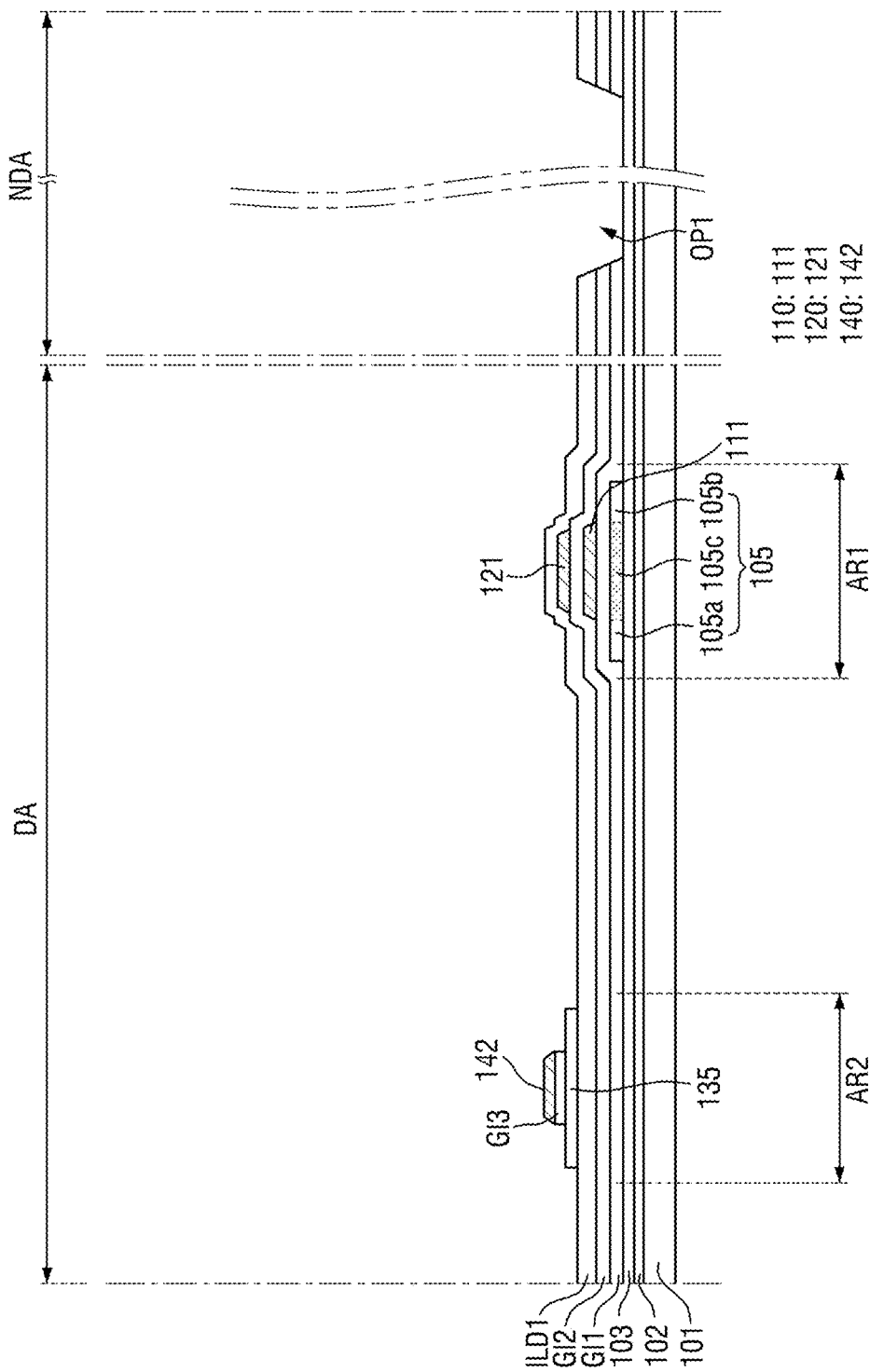
FIGS. 15 to 25 are cross-sectional views illustrating process operations after a process operation of forming an oxide semiconductor pattern in a method of manufacturing a display device according to some example embodiments.
Figure 16:
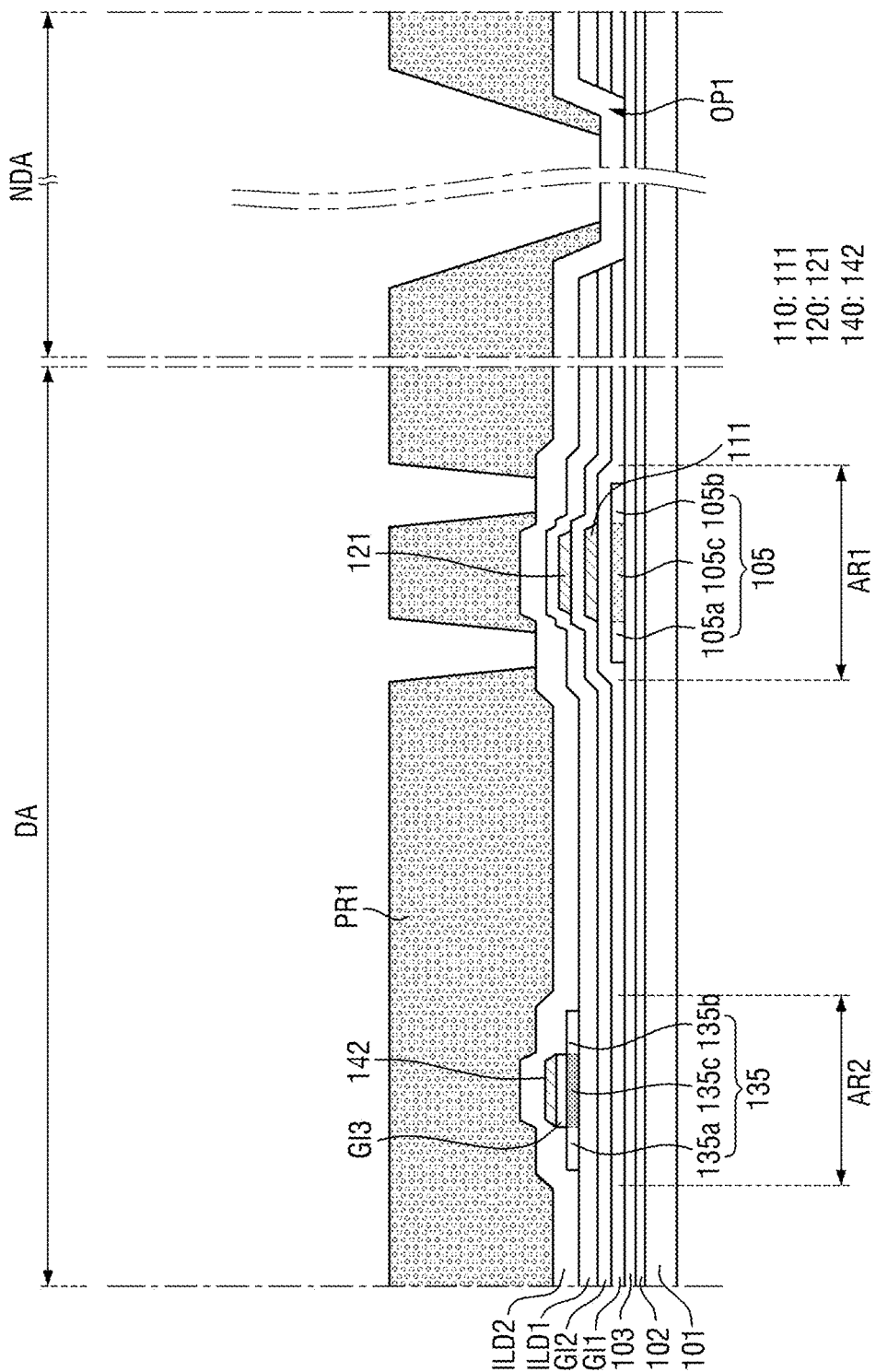
Figure 17:
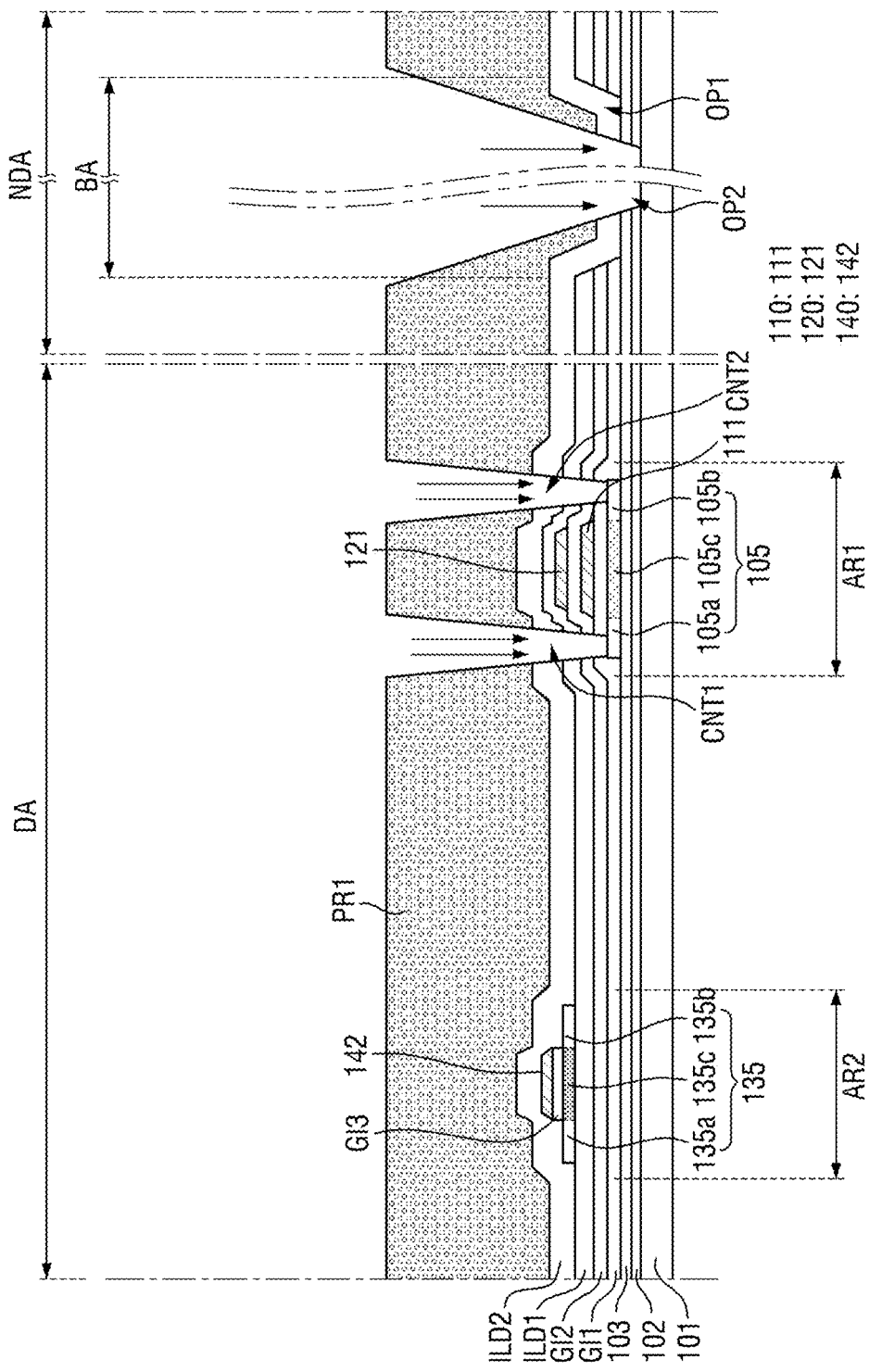
Figure 18:
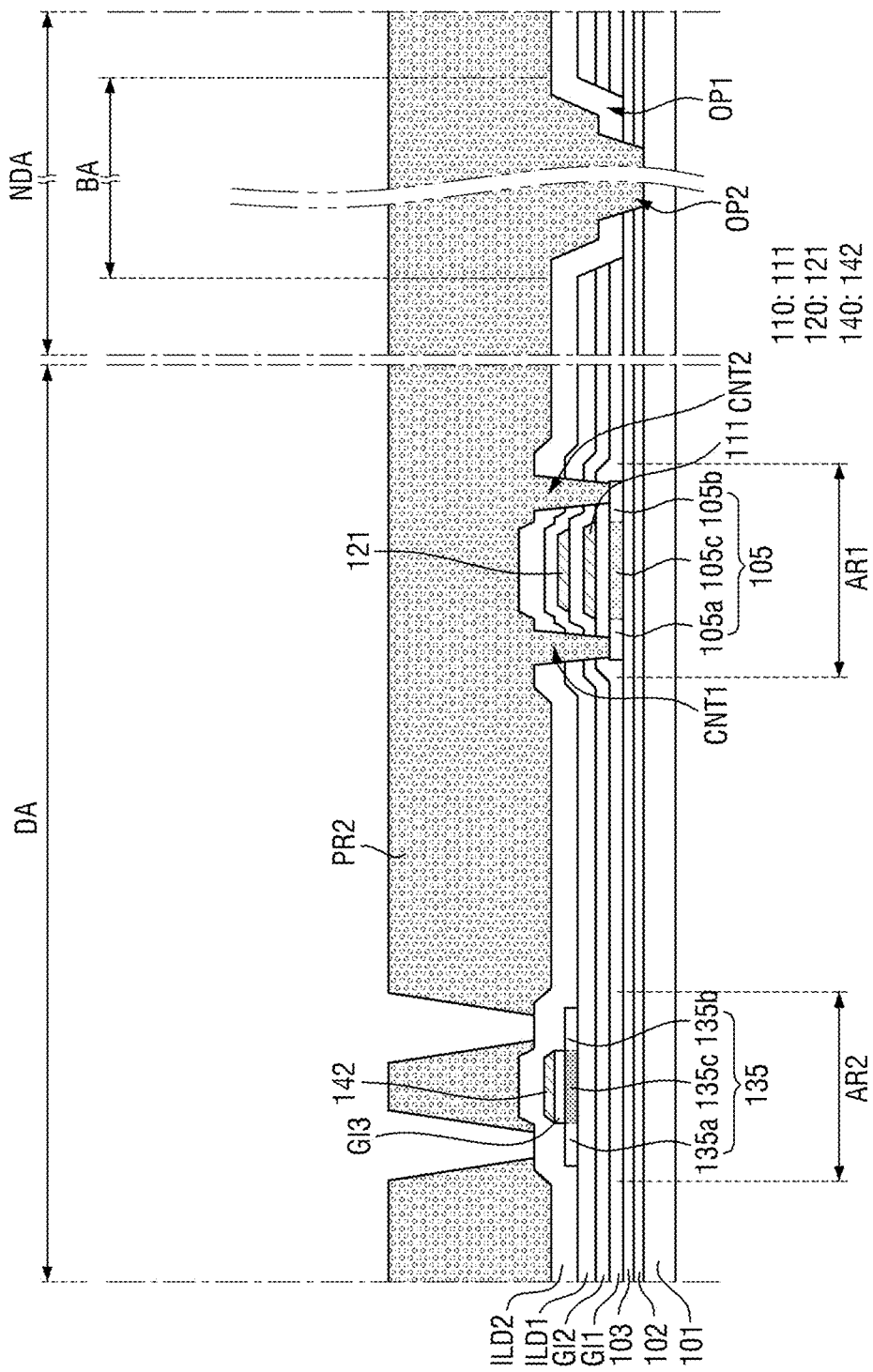
Figure 19:
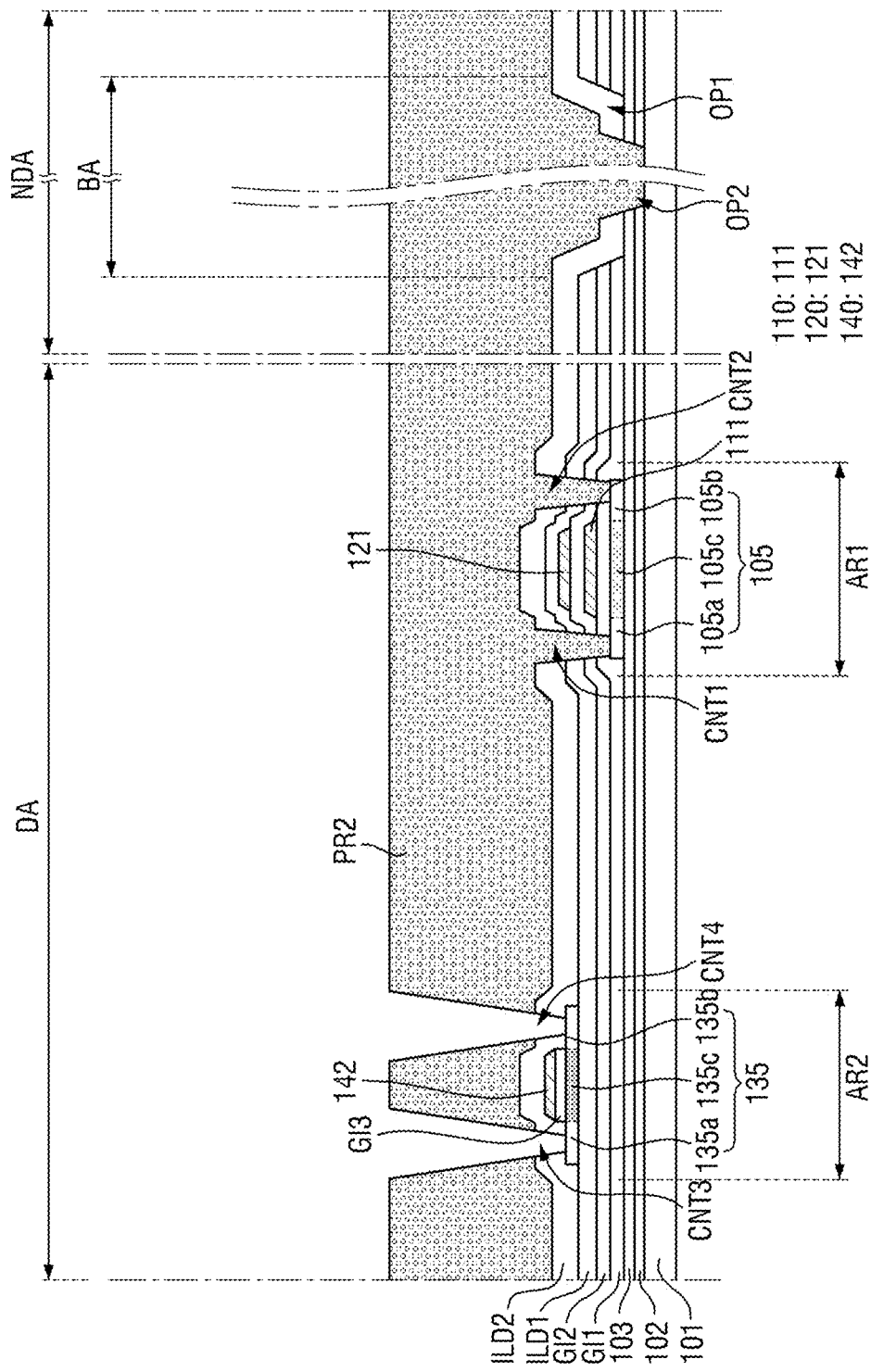

Subsequently, referring to FIGS. 13 and 14, the first interlayer insulating film ILD, the second gate insulating film GI2, the first gate insulating film GI1, and the portion of the buffer layer 103 are etched and then an ashing process is performed thereon (S04_3). Thereafter, an oxide semiconductor pattern is formed (S04_4).

For example, the photoresist PRO for the oxide semiconductor layer of the third region R3 may be partially removed by the ashing process so that an amount (e.g., a set or predetermined amount) of the photoresist PRO for the oxide semiconductor layer may remain and the photoresist PRO for the oxide semiconductor layer of the first region R1 may be fully removed. Accordingly, the material OX for the oxide semiconductor layer of the third region R3 may not be exposed, but the material OX for the oxide semiconductor layer of the first region R1 may be exposed.

The exposed material OX for the oxide semiconductor layer of the first region R1 may be removed by etching, and accordingly, an oxide semiconductor pattern including an oxide semiconductor layer 135 may be formed (S04_4).

Hereinafter, process operations after the process operation of forming the oxide semiconductor pattern will be described.

FIGS. 15 to 25 are cross-sectional views illustrating process operations after the process operation of forming the oxide semiconductor pattern in the method of manufacturing the display device according to the embodiment.

Referring again to FIGS. 5 and 15, a third gate insulating film GI3 is formed on the oxide semiconductor layer 135, and a third gate electrode 142 is formed on the third gate insulating film GI3 (S05).

For example, the patterned third gate insulating film GI3 and the patterned third gate electrode 142 may be formed by one mask process. A material layer for a third gate insulating film is deposited on an entire surface of the first interlayer insulating film ILD1 on which the oxide semiconductor layer 135 is formed, and subsequently, a material layer for a third gate electrode is deposited on the deposited entire surface of the material layer for the third gate insulating film. Subsequently, a photoresist layer is deposited on the material layer for the third gate electrode, a photoresist pattern is formed by exposure and development, and then the material layer for the third gate electrode and the material layer for the third gate insulating film are sequentially etched using the photoresist pattern as an etching mask. Thereafter, the photoresist pattern is removed by a stripping or ashing process. In the above, the case in which the photoresist pattern is used as the etching mask until the third gate insulating film GI3 is patterned is illustrated. However, a patterned upper layer may be used as a hard mask for etching a layer thereunder. In this case, the photoresist pattern may be used as an etching mask together with a hard mask. As another example, after the hard mask is formed, the photoresist pattern may be removed and a layer under the hard mask may be etched using the hard mask as the etching mask.

Subsequently, referring to FIGS. 16 to 19, a second interlayer insulating film ILD2 is stacked on the third gate electrode 142, and first to fourth contact holes CNT1, CNT2, CNT3, and CNT4 and a bending opening OP2 are formed (S06).

For example, the second interlayer insulating film ILD2 may be formed on the entire surface of the first interlayer insulating film ILD1 on which the third gate insulating film GI3 and the third gate electrode 142 are located, and the first contact hole CNT1 and the second contact hole CNT2 are first formed in the second interlayer insulating film ILD2.

The first contact hole CNT1 and the second contact hole CNT2 may be formed by one mask process. The first contact hole CNT1 and the second contact hole CNT2 may be simultaneously formed using the same mask. For example, an insulating layer for a second interlayer insulating film may be deposited on an entire surface of the second gate insulating film GI2 on which the oxide semiconductor layer 135, the third gate insulating film GI3, and the third gate electrode 142 are formed. Subsequently, a first photoresist pattern PR1 which exposes a portion of the silicon semiconductor layer 105 is formed on the insulating layer for the second interlayer insulating film, and the insulating layer for the second interlayer insulating film, the second gate insulating film GI2, and the first gate insulating film GI1 are etched using the first photoresist pattern PR1 as an etching mask so that the first contact hole CNT1 and the second contact hole CNT2 which expose the portion of the silicon semiconductor layer 105 are formed. In this case, the first photoresist pattern PR1 may not include a pattern which exposes a portion of the oxide semiconductor layer 135. That is, in the above process, an upper portion of the oxide semiconductor layer 135 may be covered and protected by the first photoresist pattern PR1 and may not be etched.

After the first contact hole CNT1 and the second contact hole CNT2 are formed, the third contact hole CNT3 and the fourth contact hole CNT4 may be formed in the second interlayer insulating film ILD2.

The third contact hole CNT3 and the fourth contact hole CNT4 may be formed by a mask process. The third contact hole CNT3 and the fourth contact hole CNT4 may be simultaneously formed using the same mask. For example, a second photoresist pattern PR2 which exposes a portion of the oxide semiconductor layer 135 is formed on the second interlayer insulating film ILD2 in which the first contact hole CNT1 and the second contact hole CNT2 are formed, and the second interlayer insulating film ILD2 is etched using the second photoresist pattern PR2 as an etching mask so that the third contact hole CNT3 and the fourth contact hole CNT4 which expose the portion of the oxide semiconductor layer 135 are formed. In this case, the second photoresist pattern PR2 may cover and protect the first contact hole CNT1 and the second contact hole CNT2 which expose the portion of the silicon semiconductor layer 105, and the portion of the silicon semiconductor layer 105, which is exposed by the first contact hole CNT1 and the second contact hole CNT2, may not be etched. In addition, as will be described in more detail below, the bending opening OP2 may be formed in the process of forming the first contact hole CNT1 and the second contact hole CNT2, and the bending opening OP2 may also be covered and protected by the second photoresist pattern PR2.

In addition, the bending opening OP2 may be formed in the non-display region NDA by the operation S06 of forming the first to fourth contact holes CNT1, CNT2, CNT3, and CNT4 without any additional process.

Thicknesses of the second interlayer insulating film ILD2, the buffer layer 103, and the barrier layer 102 in the bending region BA may be similar to thicknesses of the second interlayer insulating film ILD2, the first interlayer insulating film ILD1, the second gate insulating film GI2, and the first gate insulating film GI1 in the silicon transistor region AR1. That is, when the second interlayer insulating film ILD2, the buffer layer 103, and the barrier layer 102 are etched in the bending region BA, the method of etching the above components may be substantially the same as the method of etching the second interlayer insulating film ILD2, the first interlayer insulating film ILD1, the second gate insulating film GI2, and the first gate insulating film GI1, and a separate process may be unnecessary. Therefore, the second interlayer insulating film ILD2, the buffer layer 103, and the barrier layer 102 may be etched in the bending region BA by the operation S06 so that the bending opening OP2 may be formed.

For example, the first photoresist pattern PR1 may be formed to expose the portion of the silicon semiconductor layer 105 and the bending opening OP2 of the bending region BA. When etching is performed using the first photoresist pattern PR1, the second interlayer insulating film ILD2, the buffer layer 103, and the barrier layer 102 in the bending region BA may be simultaneously etched in the process of forming the first contact hole CNT1 and the second contact hole CNT2, and thus a portion of the base substrate 101 in the corresponding region may be exposed.

However, the bending opening OP2 may be formed not only by the process of forming the first contact hole CNT1 and the second contact hole CNT2 but also by the process of forming the first contact hole CNT1 and the second contact hole CNT2 and the process of forming the third contact hole CNT3 and the fourth contact hole CNT4.

Figure 20:
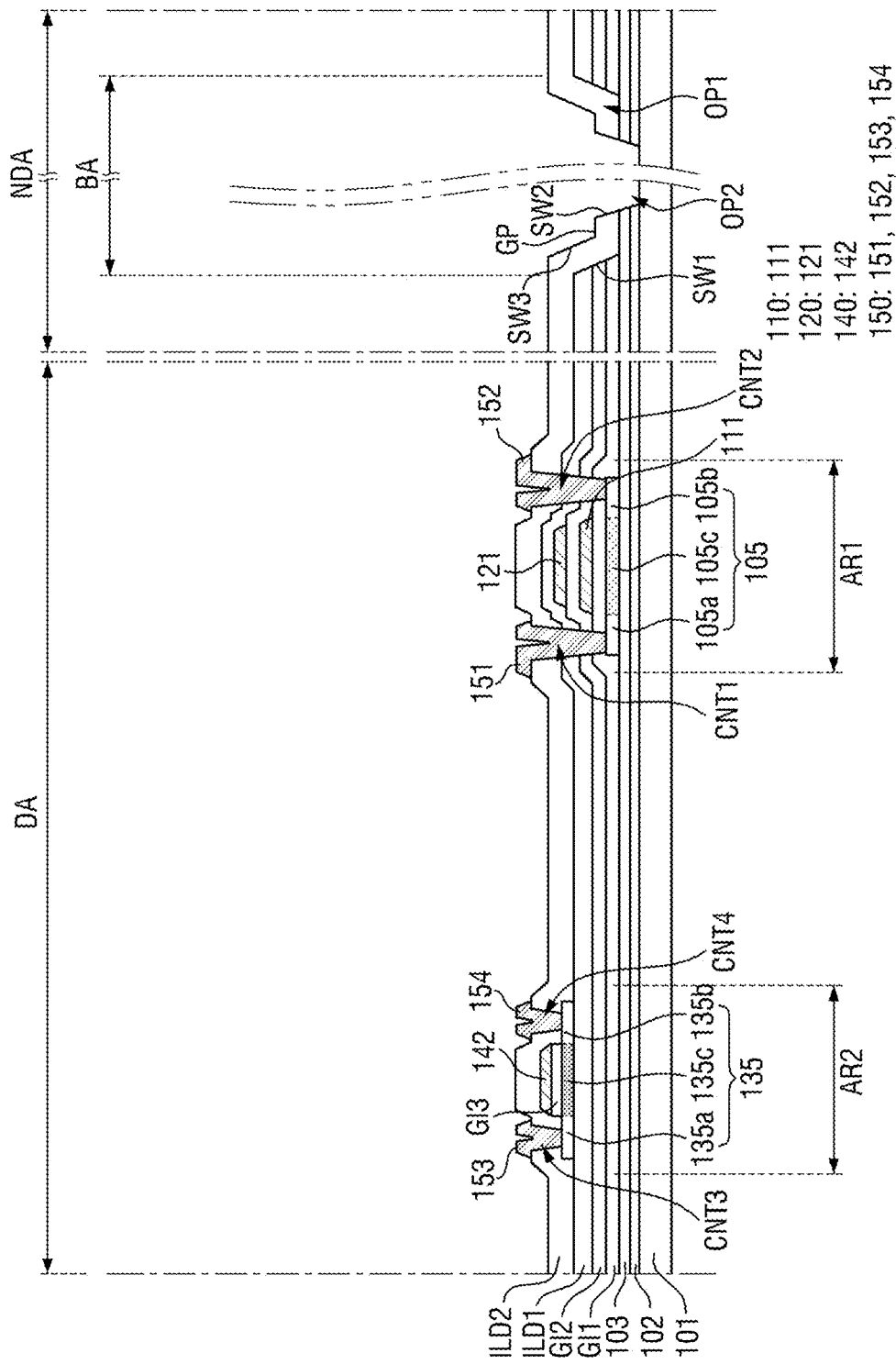

Subsequently, referring to FIG. 20, a patterned fourth conductive layer 150 is formed on the second interlayer insulating film ILD2 (S07). The fourth conductive layer 150 may include first and second source/drain electrodes 151 and 152 of a transistor located in the silicon transistor region AR1 and first and second source/drain electrodes 153 and 154 of a transistor located in the oxide transistor region AR2. The patterned fourth conductive layer 150 may be formed by a mask process. For example, a material layer for a fourth conductive layer may be deposited on an entire surface of the second interlayer insulating film ILD2. In the deposition process, the material layer for the fourth conductive layer may be deposited on inner sides of the first to fourth contact holes CNT1, CNT2, CNT3, and CNT4. Therefore, the first and second source/drain electrodes 151 and 152 of the transistor located in the silicon transistor region AR1 and the first and second source/drain electrodes 153 and 154 of the transistor located in the oxide transistor region AR2 may be respectively connected to the silicon semiconductor layer 105 and the oxide semiconductor layer 135. Subsequently, a photoresist layer is deposited on the material layer for the fourth conductive layer, a photoresist pattern is formed by exposure and development, and then the material layer for the fourth conductive layer is etched using the photoresist pattern as an etching mask. Thereafter, the photoresist pattern is removed by a stripping or ashing process and thus the patterned fourth conductive layer 150 is completely formed as illustrated in FIG. 20.

Figure 21:
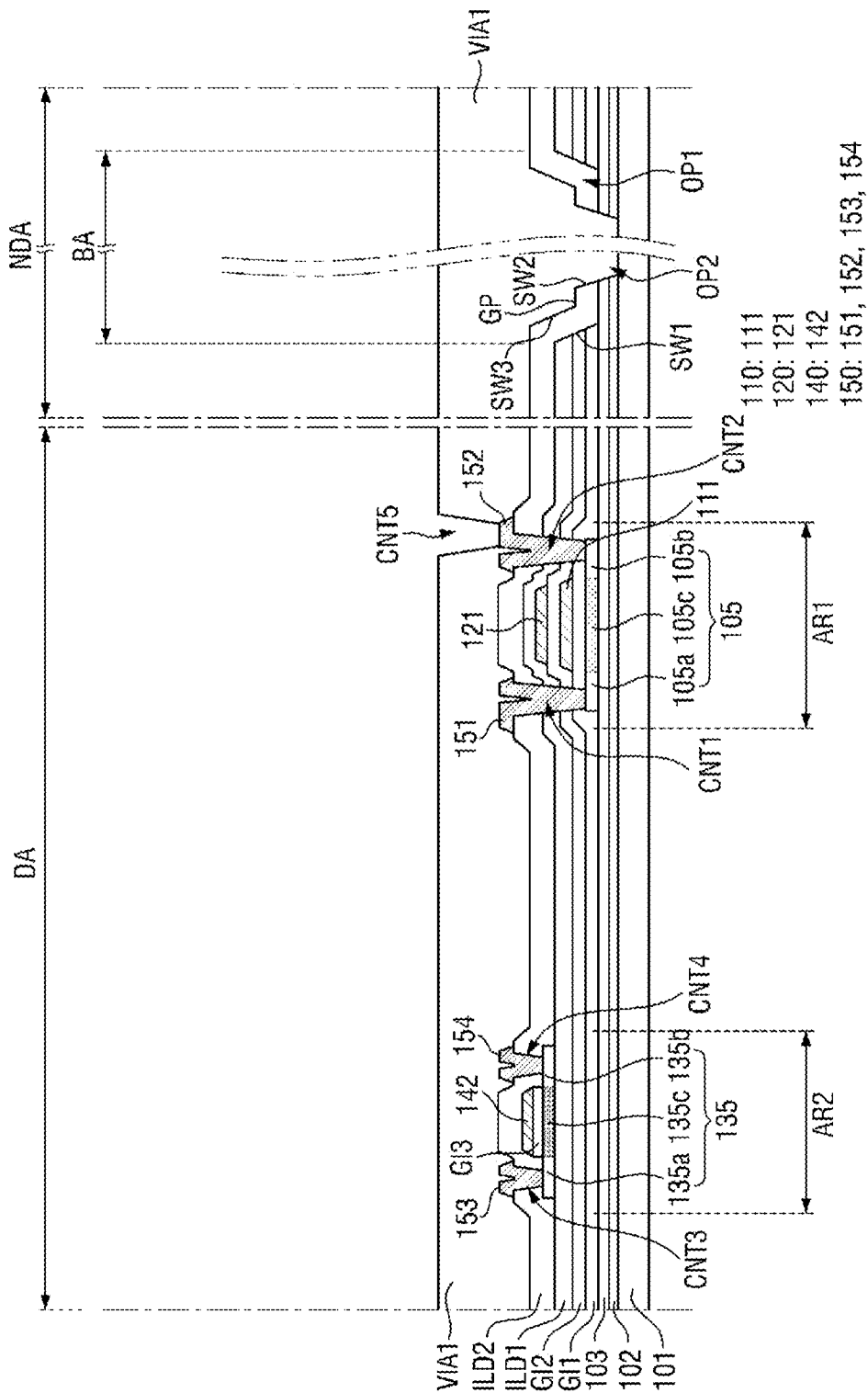

Subsequently, referring to FIG. 21, a first via layer VIA1 is formed on the fourth conductive layer 150, and a fifth contact hole CNT5 which exposes portions of the first and second source/drain electrodes 151 and 152 of the transistor located in the silicon transistor region AR1 is formed (S08).

The first via layer VIA1 may include, for example, an organic material including a photosensitive material. The first via layer VIA1 may be stacked over the display region DA and the non-display region NDA and may have a roughly flat surface. In this case, the bending opening OP2 of the bending region BA of the non-display region NDA may also be filled with the first via layer VIA1. After an organic material layer for a via layer is deposited, the fifth contact hole CNT5 which exposes the portions of the first and second source/drain electrodes 151 and 152 of the transistor located in the silicon transistor region AR1 may be formed in the first via layer VIA1 by exposure and development.

Figure 22:
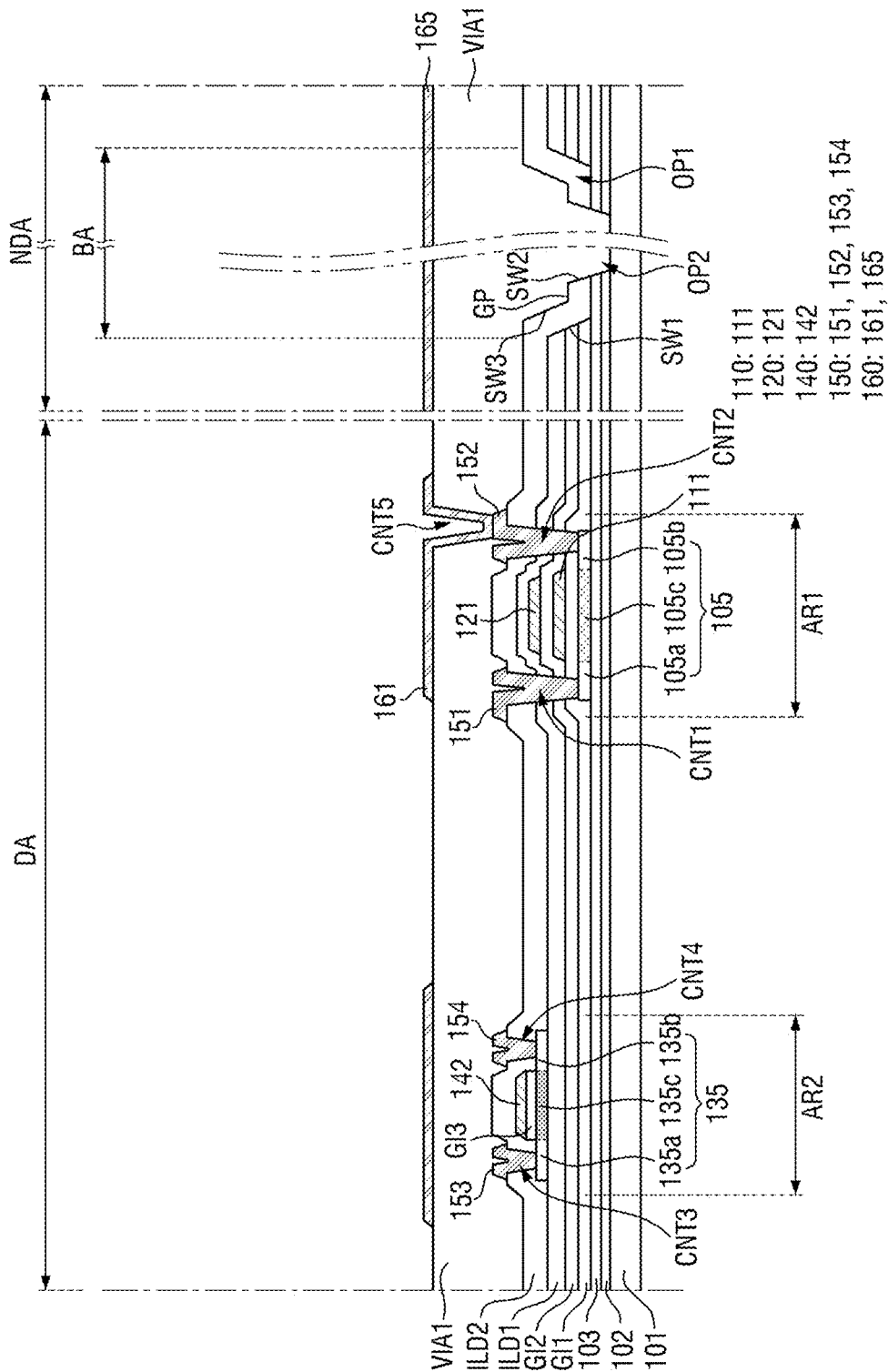

Subsequently, referring to FIG. 22, a fifth conductive layer 160 is formed on the first via layer VIA1 (S09).

The fifth conductive layer 160 may include a connection electrode 161 located in the display region DA and a connection line 165 located in the non-display region NDA. The patterned fifth conductive layer 160 may be formed by a mask process. For example, a material layer for a fifth conductive layer may be deposited on an entire surface of the first via layer VIA1. In the deposition process, the material layer for the fifth conductive layer may be deposited on an inner side of the fifth contact hole CNT5. Therefore, the connection electrode 161 may be connected to the first and second source/drain electrodes 151 and 152 of the transistor located in the silicon transistor region AR1. Subsequently, a photoresist layer is deposited on the material layer for the fourth conductive layer, a photoresist pattern is formed by exposure and development, and then the material layer for the fifth conductive layer is etched using the photoresist pattern as an etching mask. Thereafter, the photoresist pattern is removed by a stripping or ashing process and thus the patterned fifth conductive layer 160 is completely formed as illustrated in FIG. 21.

Figure 23:
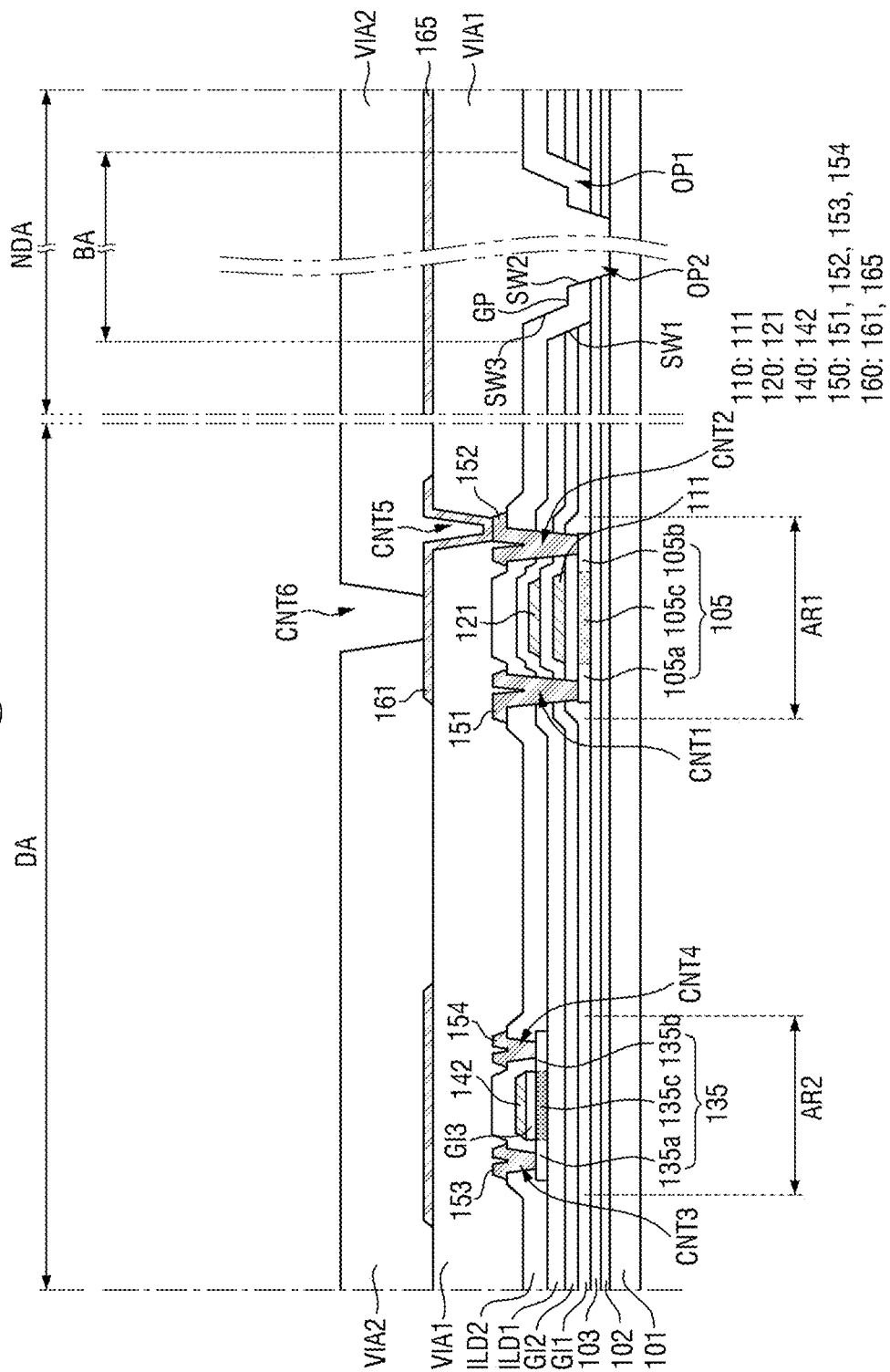

Subsequently, referring to FIG. 23, a second via layer VIA2 is formed on the fifth conductive layer 160, and a sixth contact hole CNT6 which exposes a portion of the connection electrode 161 is formed (S10).

The second via layer VIA2 may include, for example, an organic material including a photosensitive material. The second via layer VIA2 may be stacked only in the display region DA and may have a roughly flat surface. After an organic material layer for a via layer is deposited, the sixth contact hole CNT6 which exposes the portion of the connection electrode 161 may be formed in the second via layer VIA2 by exposure and development.

Figure 24:
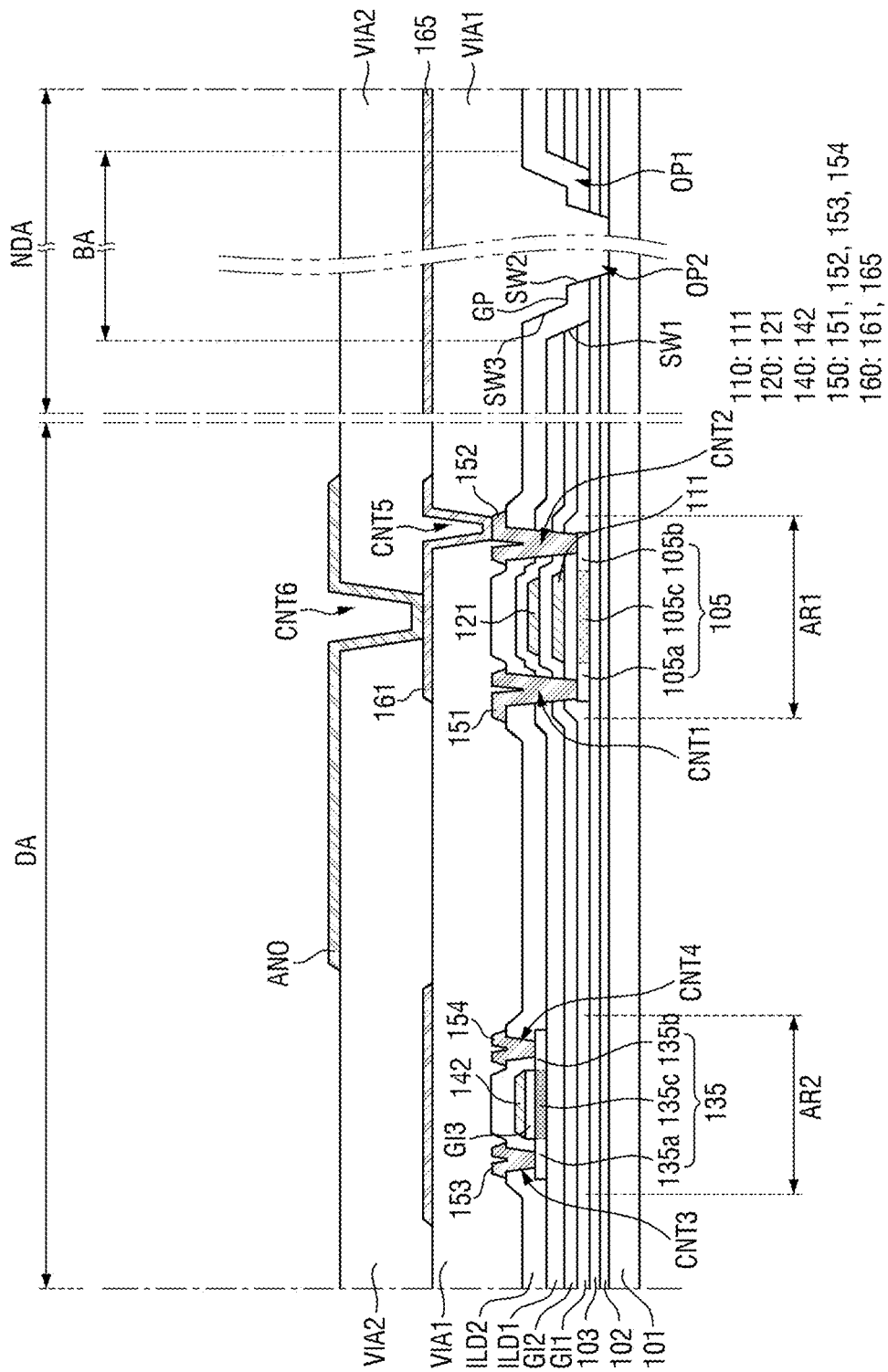

Subsequently, referring to FIG. 24, an anode electrode ANO is formed on the second via layer VIA2 (S11).

The patterned anode electrode ANO may be formed by a mask process. For example, a material layer for an anode electrode may be deposited on an entire surface of the second via layer VIA2. In the deposition process, the material layer for the anode electrode may be deposited on an inner side of the sixth contact hole CNT6 and connected to the connection electrode 161.

Figure 25:
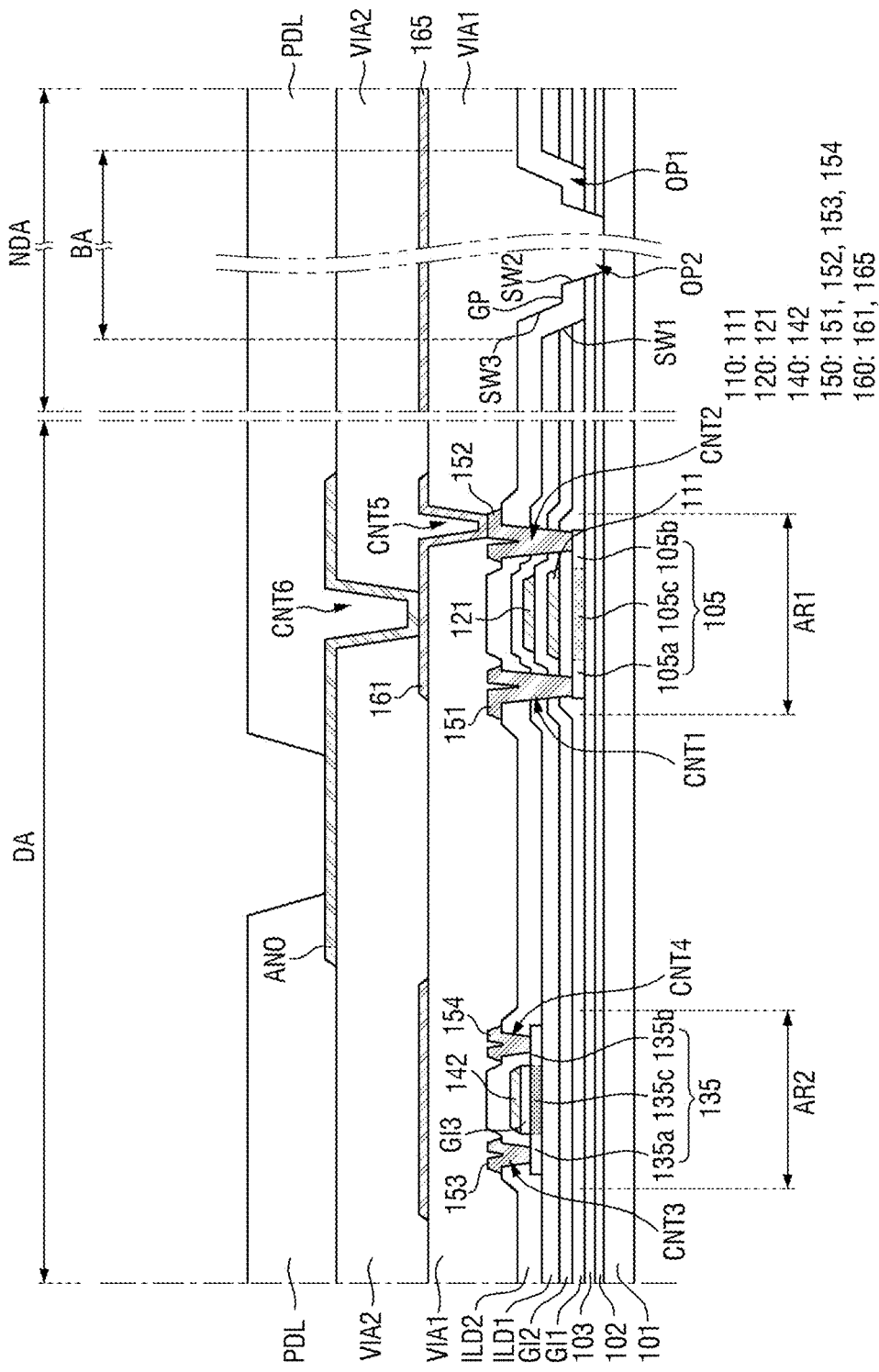

Subsequently, referring to FIG. 25, a patterned pixel definition film PDL is formed on the second via layer VIA2 in which the anode electrode ANO is formed (S12).

The pixel definition film PDL may include, for example, an organic material including a photosensitive material. In this case, the patterned pixel definition film PDL may be formed by applying an organic material layer for a bank layer and then performing exposure and development.

The pixel definition film PDL may be formed along a boundary of the pixel PX and may partially overlap the anode electrode ANO. The pixel definition film PDL may be formed to overlap the sixth contact hole CNT6. When an inner space of the sixth contact hole CNT6 is partially filled with the anode electrode ANO, the inner space of the sixth contact hole CNT6 may be fully filled with the pixel definition film PDL.

As described above, according to some example embodiments, a separate mask process for forming the bending opening OP2 is unnecessary. Therefore, the number of mask processes may be reduced, and thus process efficiency may be improved.

Hereinafter, other embodiments will be described. In the following embodiments, the same configuration as the above-described embodiment will be omitted or simplified, and differences between the following embodiments and the above-described embodiment will be mainly described.

Figure 26:
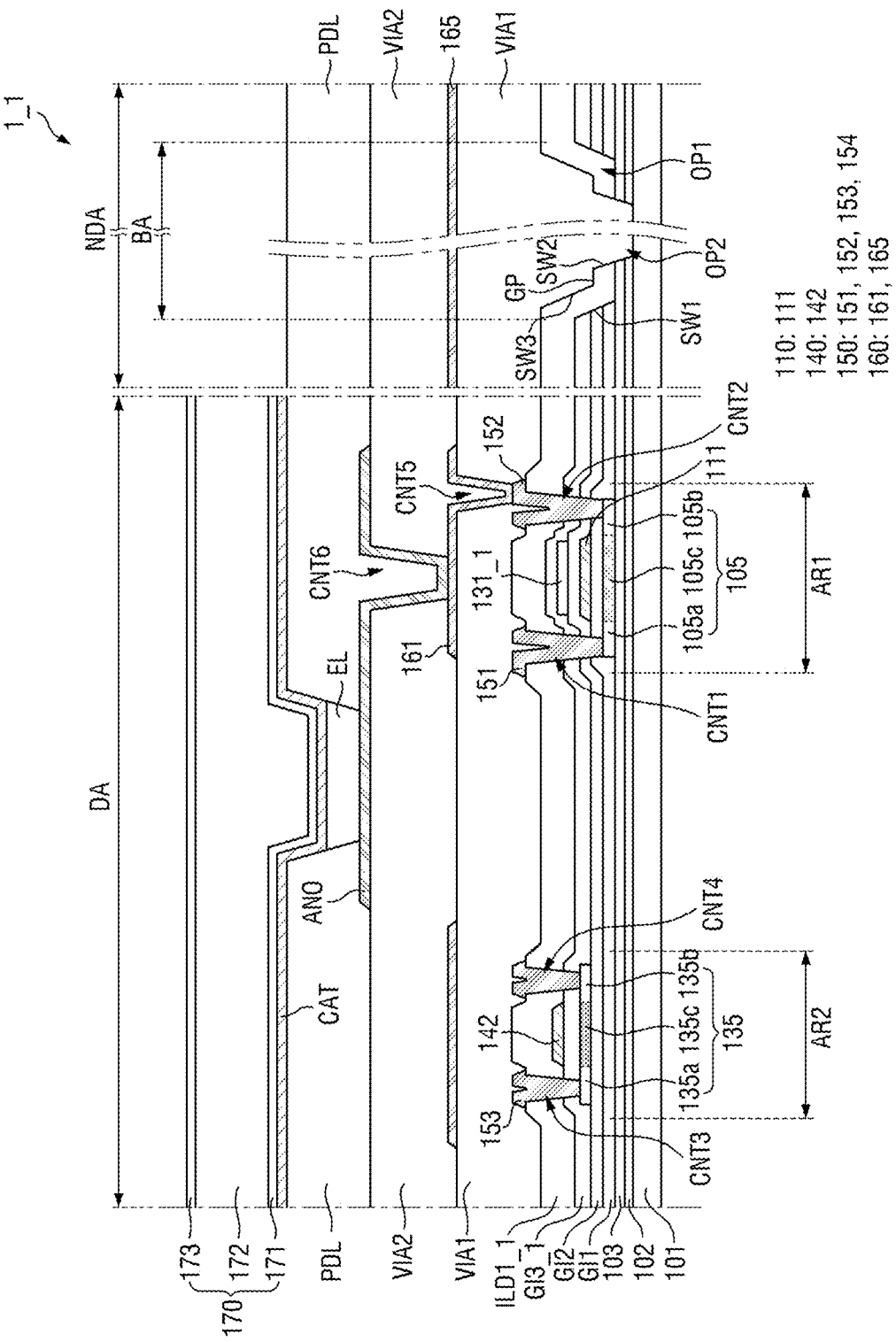
FIG. 26 is a cross-sectional view of a display device according to some example embodiments.

FIG. 26 is a cross-sectional view of a display device according to some example embodiments t.

Referring to FIG. 26, a display device 1_1 according to the present embodiment is different from the display device in the embodiment of FIG. 4 in that an oxide electrode 131_1 is located instead of a second electrode 121 of a capacitor Cst.

For example, unlike the embodiment of FIG. 4 in which the second electrode 121 of the capacitor Cst is located on the second gate insulating film GI2, the display device 1_1 according to the present embodiment may not include the second electrode 121 of the capacitor Cst and an oxide semiconductor layer 135 may be located on a second gate insulating film GI2. In addition, the oxide electrode 131_1 may be located in a silicon transistor region AR1 on the second gate insulating film GI2 on which the oxide semiconductor layer 135 is located. The oxide semiconductor layer 135 and the oxide electrode 131_1 may be simultaneously formed on the same layer using the same mask and may be formed of the same material. Further, the oxide electrode 131_1 may serve as a second electrode of the capacitor Cst similar to the second electrode 121 of the capacitor Cst in the embodiment of FIG. 4. That is, a first gate electrode 111 and the oxide electrode 131_1 may form a capacitor Cst using the second gate insulating film GI2 located therebetween as a dielectric.

Unlike the third gate insulating film GI3 stacked only in the partial region in the embodiment of FIG. 4, a third gate insulating film GI3_1 may be stacked over an entire region of the second gate insulating film GI2 on the second gate insulating film GI2 on which the oxide semiconductor layer 135 and the oxide electrode 131_1 are located.

A first interlayer insulating film ILD1_1 may be stacked on the third gate insulating film GI3_1, and a fourth conductive layer 150 may be located on the first interlayer insulating film ILD1_1. A first via layer VIA1 may be stacked on the fourth conductive layer 150, and the display device 1_1 according to some example embodiments may not include a second interlayer insulating film ILD2.

In addition, a sidewall of a bending peripheral opening OP1 may be formed of the third gate insulating film GI3_1, the second gate insulating film GI2, and a first gate insulating film GI1, and a sidewall of a bending opening OP2 may be formed of the first interlayer insulating film ILD1_1, a buffer layer 103, and a barrier layer 102. Therefore, the first gate insulating film GI1, the second gate insulating film GI2, and the third gate insulating film GI3_1 may be located at an outer side of the first interlayer insulating film ILD1_1 forming the sidewall of the bending opening OP2.

In the present embodiment, a separate mask for forming the bending opening OP2 may be unnecessary, and thus the number of masks required for the process may be reduced. In addition, a separate conductive layer for forming the capacitor Cst with the first gate electrode 111 may be unnecessary and a mask for forming the separate conductive layer may be unnecessary, and thus the number of masks required for the process may be further reduced.

Figure 27:
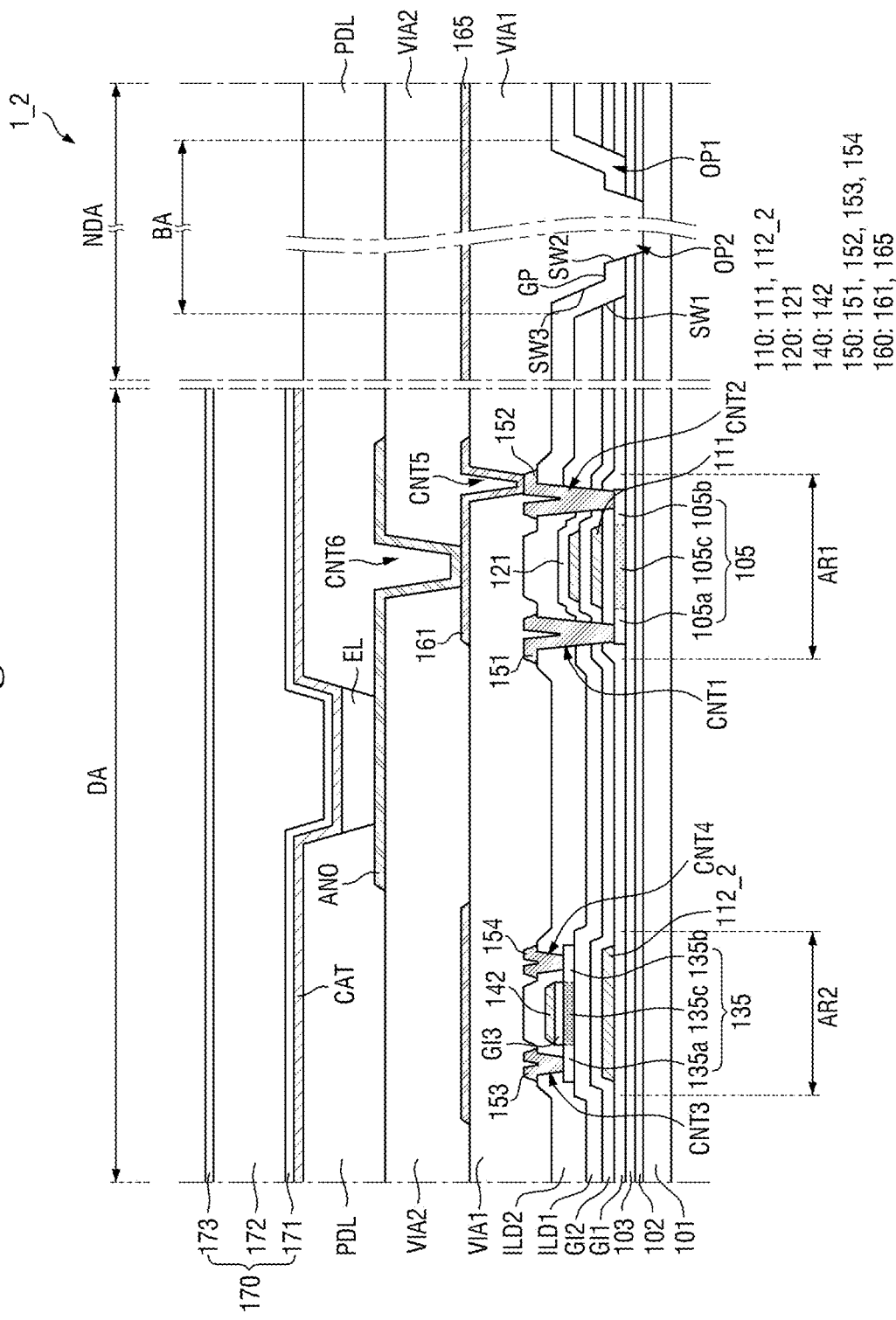
FIG. 27 is a cross-sectional view of a display device according to some example embodiments.

FIG. 27 is a cross-sectional view of a display device according to some example embodiments.

Referring to FIG. 27, a display device 1_2 according to the present embodiment is different from the display device in the embodiment of FIG. 4 in that the display device 1_2 further includes a lower light blocking pattern 112_2 in an oxide transistor region AR2.

According to some example embodiments, a first conductive layer 110 may include a first gate electrode 111 located in a silicon transistor region AR1 and the lower light blocking pattern 112_2 located in the oxide transistor region AR2. The first gate electrode 111 and the lower light blocking pattern 112_2 may be simultaneously formed on the same layer using the same mask, and thus a separate mask for forming the lower light blocking pattern 112_2 may be unnecessary. Further, the first gate electrode 111 and the lower light blocking pattern 112_2 may include the same material.

The lower light blocking pattern 112_2 may serve to prevent light incident from a lower direction of a display panel 100 from entering an oxide semiconductor layer 135 located thereabove. The lower light blocking pattern 112_2 may overlap a channel region 135c of the oxide semiconductor layer 135. Further, the lower light blocking pattern 112_2 may be used as another gate electrode of an oxide transistor. In this case, the lower light blocking pattern 112_2 may be electrically connected to a third gate electrode 142 or any one of a first source/drain electrode 153 and a second source/drain electrode 154 of a transistor located in the oxide transistor region AR2.

Even in the present embodiment, a separate mask for forming a bending opening OP2 may be unnecessary, and thus the number of masks required for the process may be reduced.

Figure 28:
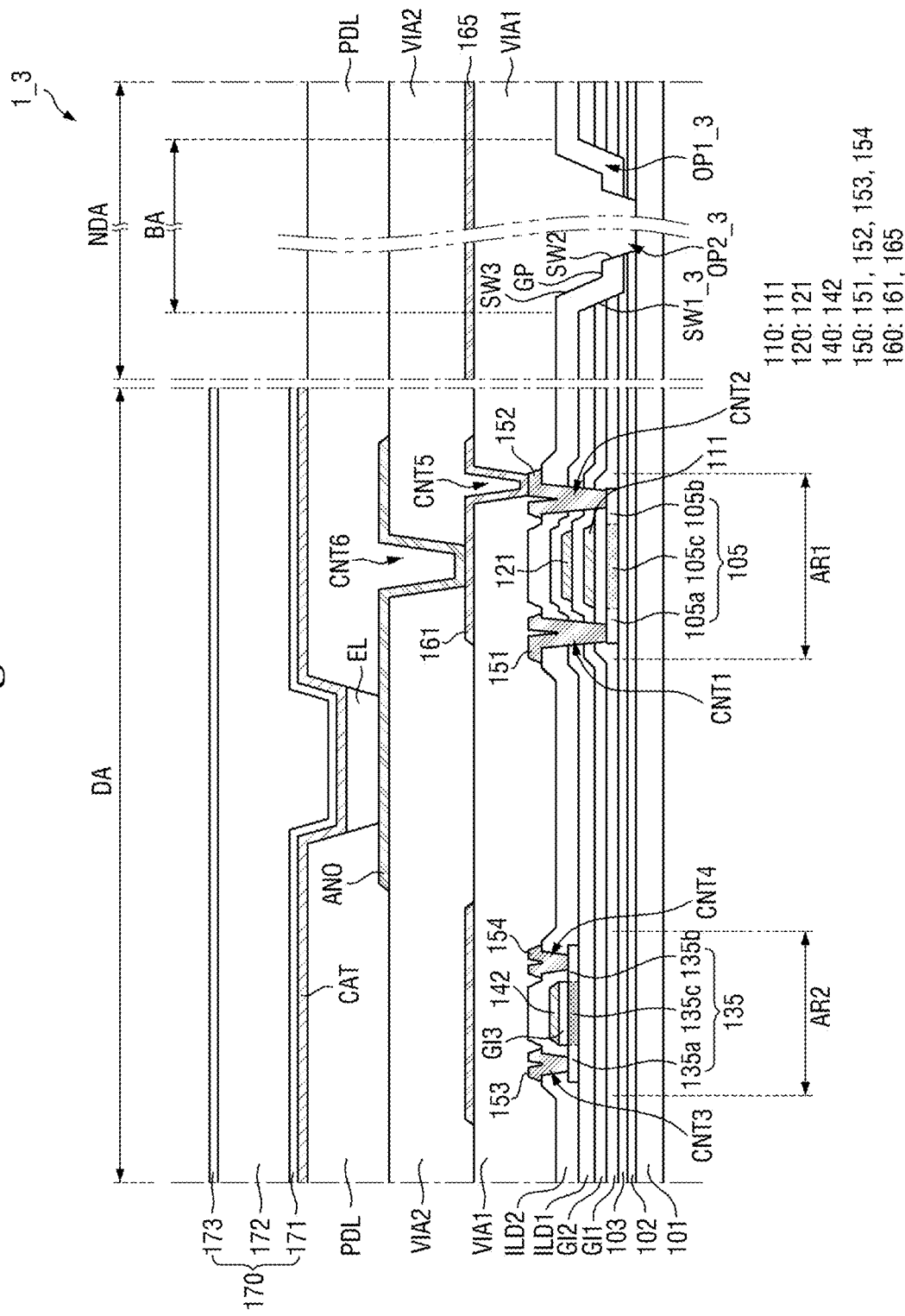
FIG. 28 is a cross-sectional view of a display device according to some example embodiments.

FIG. 28 is a cross-sectional view of a display device according to some example embodiments.

Referring to FIG. 28, a display device 1_3 according to the present embodiment is different from the display device in the embodiment of FIG. 4 in that a first sidewall SW1_3 of a bending peripheral opening OP1_3 is formed of a portion of a side surface of a buffer layer 103 as well as a side surface of a first interlayer insulating film ILD1, a side surface of a second gate insulating film GI2, and a side surface of a first gate insulating film GI1.

For example, in a process of forming the bending peripheral opening OP1_3, an upper portion of the buffer layer 103 as well as the first interlayer insulating film ILD1, the second gate insulating film GI2, and the first gate insulating film GI1 may be etched. Therefore, the bending peripheral opening OP1_3 may expose the portion of the buffer layer 103, and the first sidewall SW1_3 of the bending peripheral opening OP1_3 may be formed of the portion of the side surface of the buffer layer 103 as well as the side surface of the first interlayer insulating film ILD1, the side surface of the second gate insulating film GI2, and the side surface of the first gate insulating film GI1.

Accordingly, a thickness of the buffer layer 103 in a region in which the bending peripheral opening OP1 and the buffer layer 103 overlap may be smaller than a thickness of the buffer layer 103 in a region in which the bending peripheral opening OP1 and the buffer layer 103 do not overlap. Further, a second interlayer insulating film ILD2 forming a third sidewall SW3_3 of a bending opening OP2_3 may cover and surround the side surface of the buffer layer 103 as well as the side surfaces of the first interlayer insulating film ILD1, the second gate insulating film GI2, and the first gate insulating film GI1.

Even in the present embodiment, a separate mask for forming the bending opening OP2 may be unnecessary, and thus the number of masks required for the process may be reduced.

Figure 29:
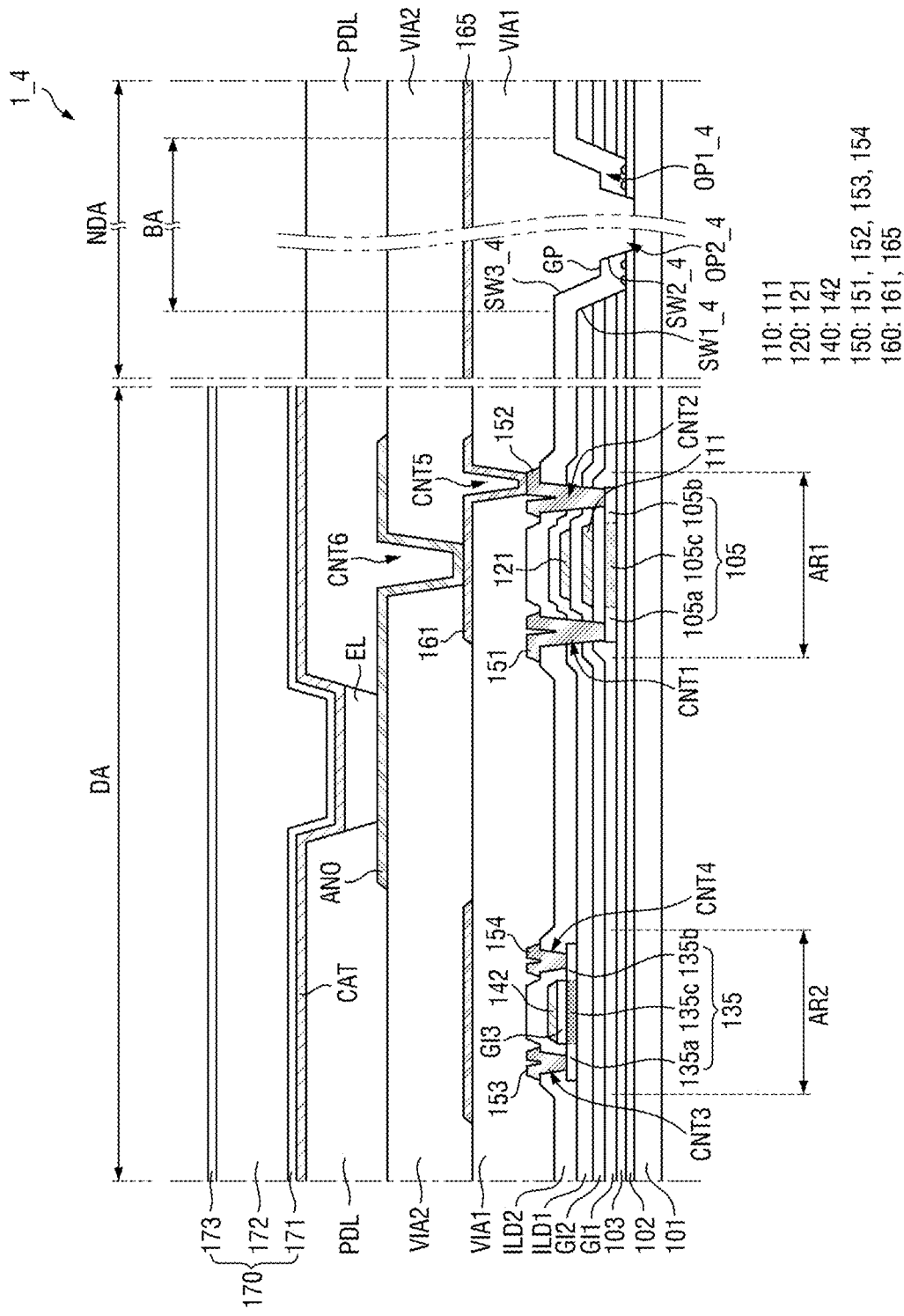
FIG. 29 is a cross-sectional view of a display device according to some example embodiments.

FIG. 29 is a cross-sectional view of a display device according to some example embodiments.

Referring to FIG. 29, a display device 1_4 according to the present embodiment is different from the display device in the embodiment of FIG. 28 in that a bending peripheral opening OP1_4 exposes portions of a buffer layer 103 and a barrier layer 102.

For example, in a process of forming the bending peripheral opening OP1_4, most of the buffer layer 103 as well as a first interlayer insulating film ILD1, a second gate insulating film GI2, and a first gate insulating film GI1 may be etched, and only a portion of the buffer layer 103 may remain on an upper surface of the barrier layer 102. The portion of the buffer layer 103 may remain on the upper surface of the barrier layer 102 in an island shape. Therefore, the bending peripheral opening OP1_4 may expose a portion of the buffer layer 103 and a portion of the upper surface of the barrier layer 102, and a first sidewall SW1_4 of the bending peripheral opening OP1_4 may be formed of a side surface of the buffer layer 103 as well as a side surface of the first interlayer insulating film ILD1, a side surface of the second gate insulating film GI2, and a side surface of the first gate insulating film GI1.

Accordingly, a second interlayer insulating film ILD2 forming a third sidewall SW3_4 of the bending opening OP2_4 may cover and surround the side surface of the buffer layer 103 as well as the side surfaces of the first interlayer insulating film ILD1, the second gate insulating film GI2, and the first gate insulating film GI1. Further, most of a second sidewall SW2_4 of the bending opening OP2_4 may be formed of the second interlayer insulating film ILD2 and the barrier layer 102.

According to some example embodiments, a separate mask for forming the bending opening OP2 may be omitted, and thus the number of masks required for the process may be reduced.

Figure 30:
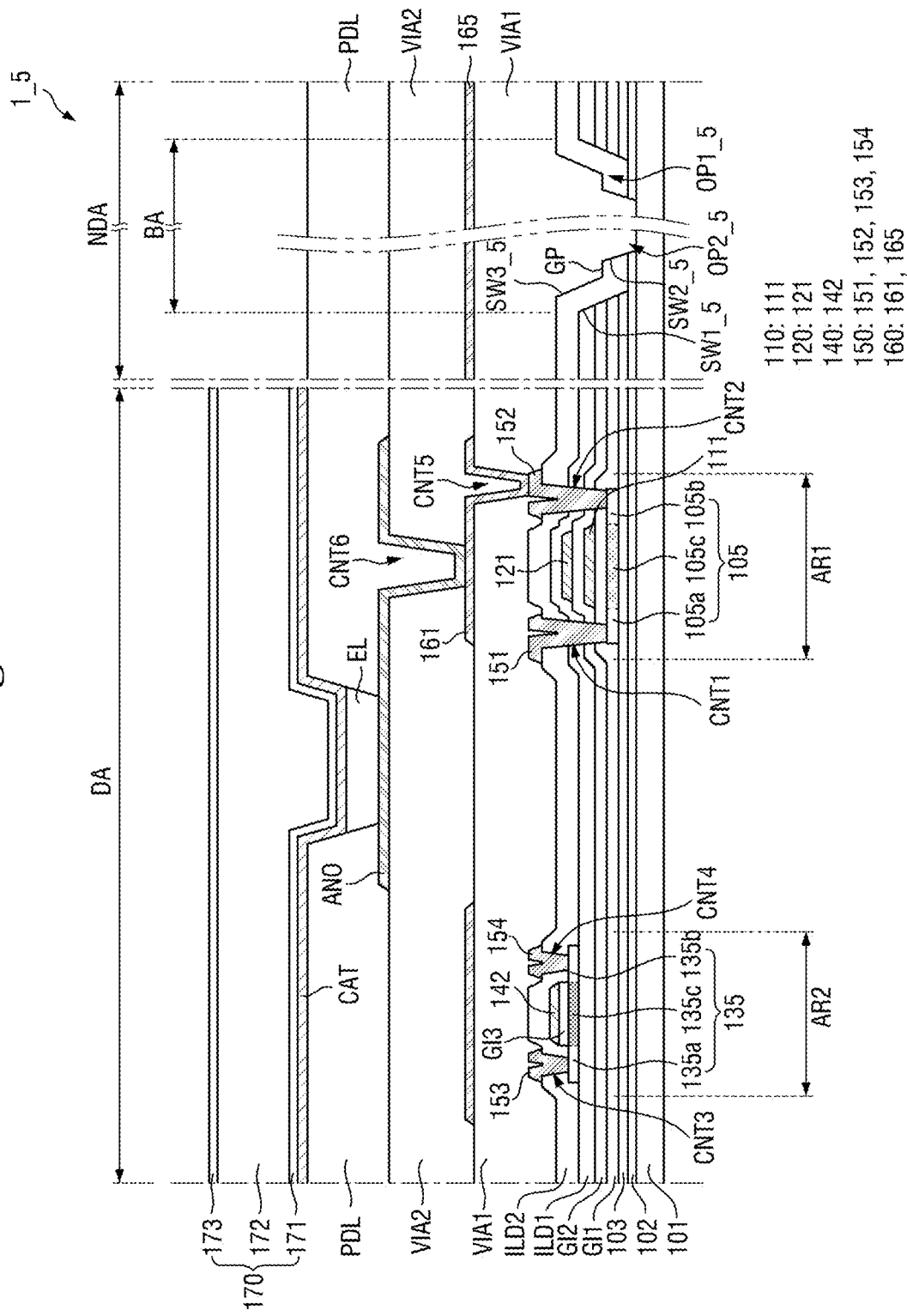
FIG. 30 is a cross-sectional view of a display device according to some example embodiments.

FIG. 30 is a cross-sectional view of a display device according to some example embodiments.

Referring to FIG. 30, a display device 1_5 according to the present embodiment is different from the display device in the embodiment of FIG. 29 in that a bending peripheral opening OP1_5 exposes only a portion of a barrier layer 102.

For example, in a process of forming the bending peripheral opening OP1_5, an entirety of a buffer layer 103 as well as a first interlayer insulating film ILD1, a second gate insulating film GI2, and a first gate insulating film GI1 may be etched. Therefore, the bending peripheral opening OP1_5 may expose only an upper surface of the barrier layer 102, and a first sidewall SW1_5 of the bending peripheral opening OP1_5 may be formed of a side surface of the buffer layer 103 as well as a side surface of the first interlayer insulating film ILD1, a side surface of the second gate insulating film GI2, and a side surface of the first gate insulating film GI1.

Accordingly, a second interlayer insulating film ILD2 forming a third sidewall SW3_5 of the bending opening OP2_5 may cover and surround the side surface of the buffer layer 103 as well as the side surfaces of the first interlayer insulating film ILD1, the second gate insulating film GI2, and the first gate insulating film GI1. Further, a second sidewall SW2_5 of the bending opening OP2_5 may be formed of the second interlayer insulating film ILD2 and the barrier layer 102.

According to some example embodiments, a separate mask for forming the bending opening OP2 may be omitted, and thus the number of masks required for the process may be reduced.

Figure 31:
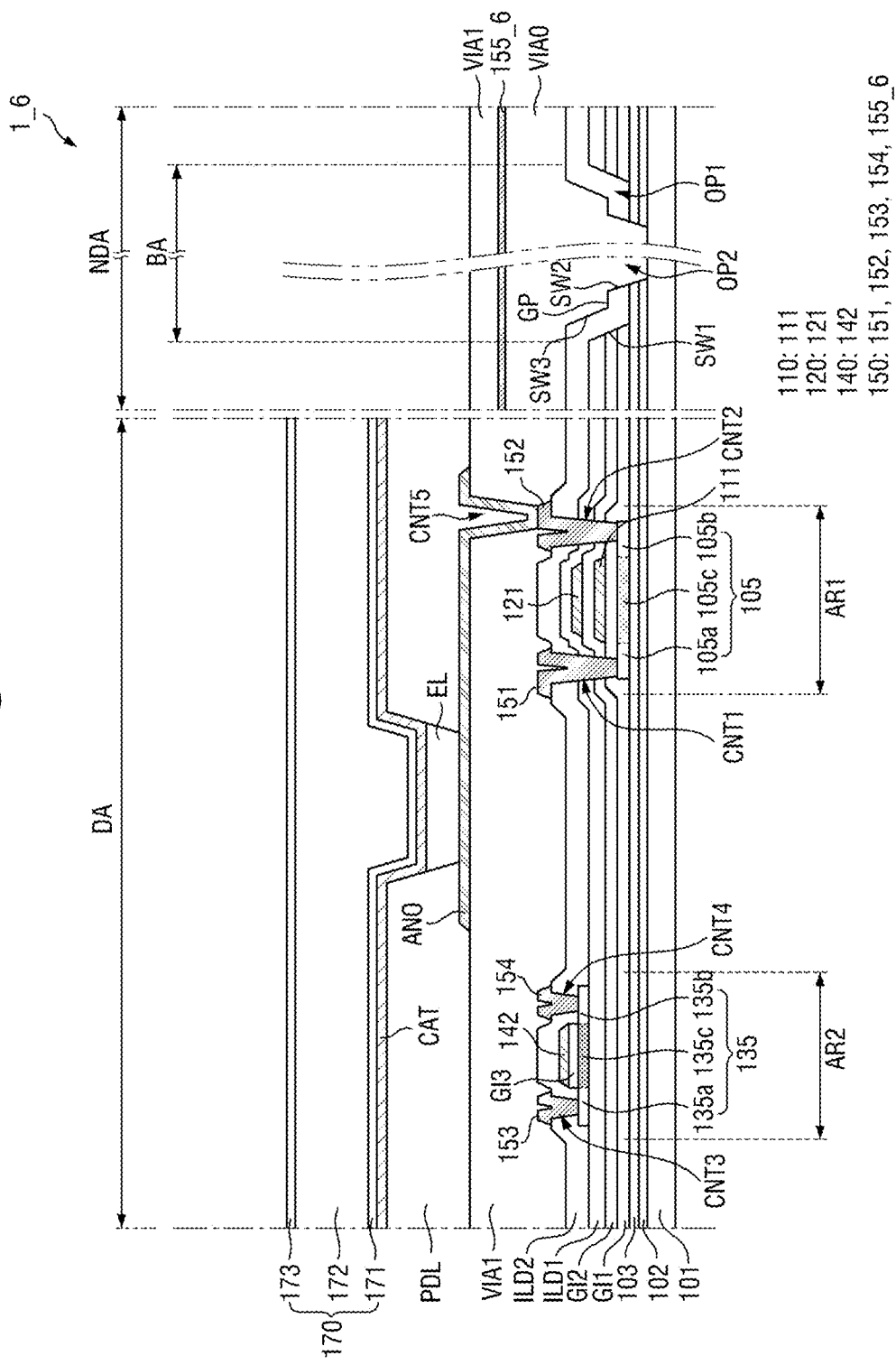
FIG. 31 is a cross-sectional view of a display device according to some example embodiments.

FIG. 31 is a cross-sectional view of a display device according to some example embodiments.

Referring to FIG. 31, a display device 1_6 according to the present embodiment is different from the display device in the embodiment of FIG. 4 in that the display device 1_6 does not include a second via layer VIA2 and a fifth conductive layer 160 and does include a bending via layer VIA0 in a non-display region NDA.

For example, in the non-display region NDA, a bending opening OP2 may be filled with the bending via layer VIA0 instead of a first via layer VIA1. The bending via layer VIA0 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, or the like. The bending via layer VIA0 may be a single film or a multilayered film formed as a stacked film of different materials. The bending via layer VIA0 may be made of the same material as the first via layer VIA1, but embodiments according to the present disclosure are not limited thereto.

A non-display region line 155_6 may be located on the bending via layer VIA0. The non-display region line 155_6 may be formed of a fourth conductive layer 150. The non-display region line 155_6 may be formed together with first and second source/drain electrodes 151 and 152 of a transistor located in a silicon transistor region AR1 and first and second source/drain electrodes 153 and 154 of a transistor located in an oxide transistor region AR2, which are described above, and may be made of the same material as the materials forming the components 151, 152, 153, and 154.

A first via layer VIA1 may be located on the non-display region line 155_6, and the first via layer VIA1 may be formed simultaneously with a first via layer VIA1 of a display region DA to have substantially the same height as a height of the first via layer VIA1 of the display region DA.

In the display region DA, an anode electrode ANO and a pixel definition film PDL may be formed on the first via layer VIA1, and the anode electrode ANO may be stacked in a sixth contact hole CNT5.

Even in this case, a separate mask for forming a bending opening OP2 may be unnecessary, and thus the number of masks required for the process may be reduced.

Hereinafter, a method of manufacturing the display device according to some example embodiments, as illustrated, for example, in FIG. 31 will be described.

Figure 32:
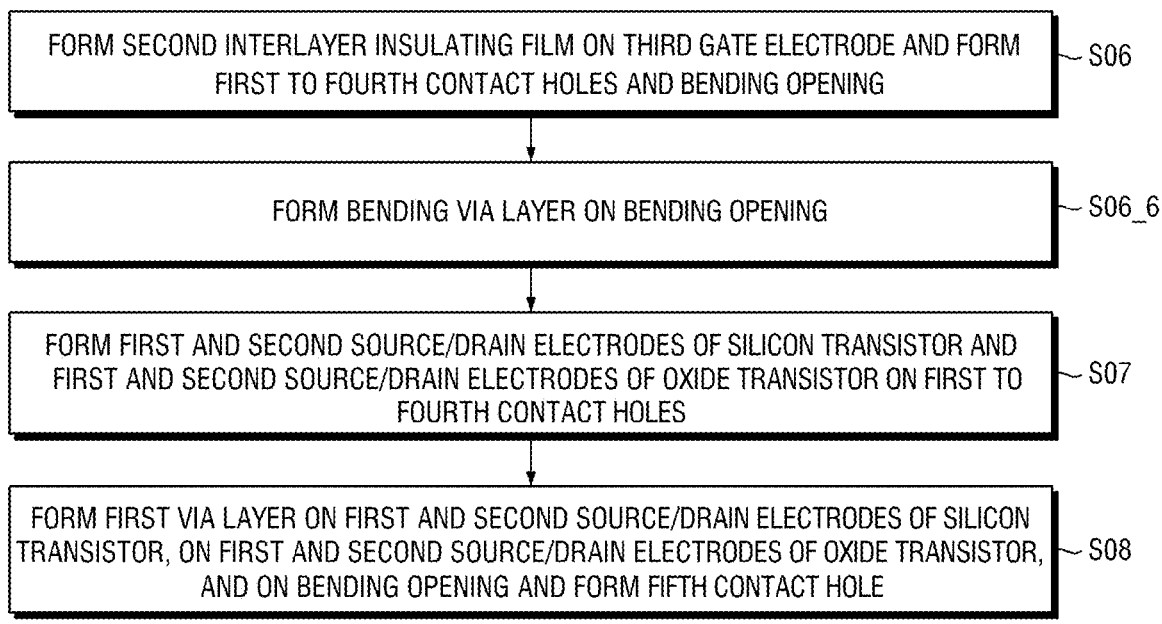
FIG. 32 is a partial flowchart illustrating a method of manufacturing the display device according to some example embodiments.
Figure 33:
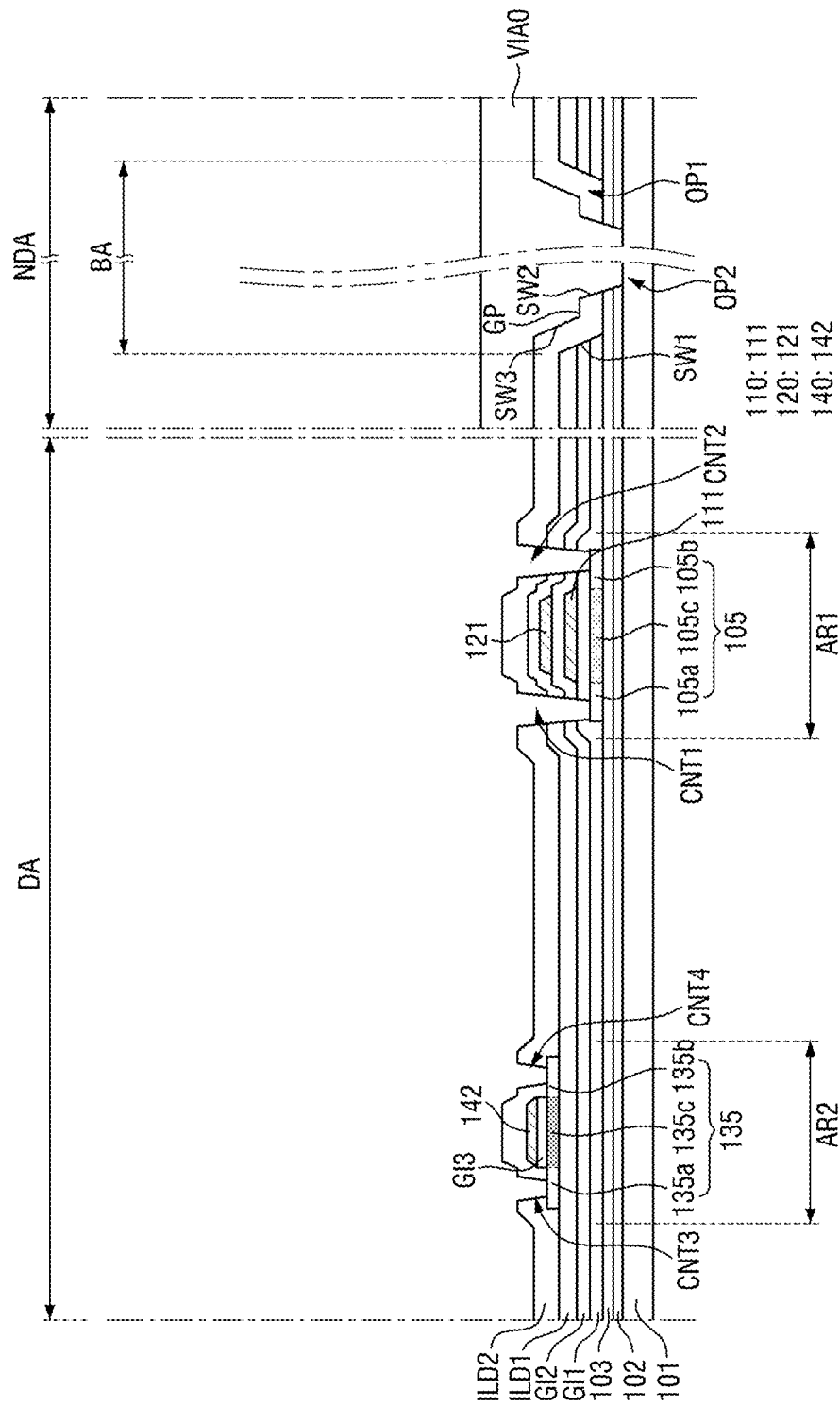
FIGS. 33 to 35 are cross-sectional views illustrating process operations of the method of manufacturing the display device according to some example embodiments.
Figure 34:
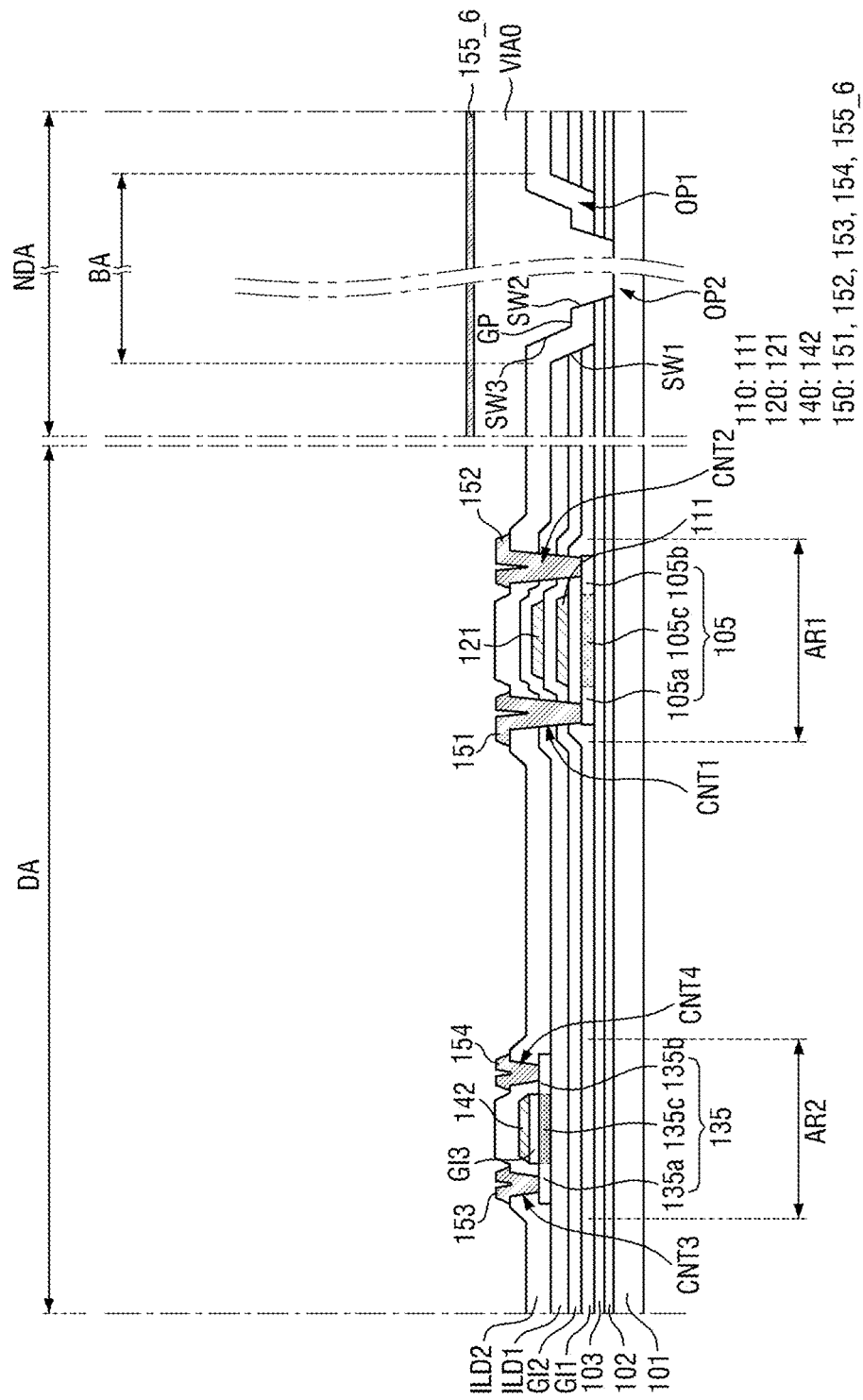
Figure 35:
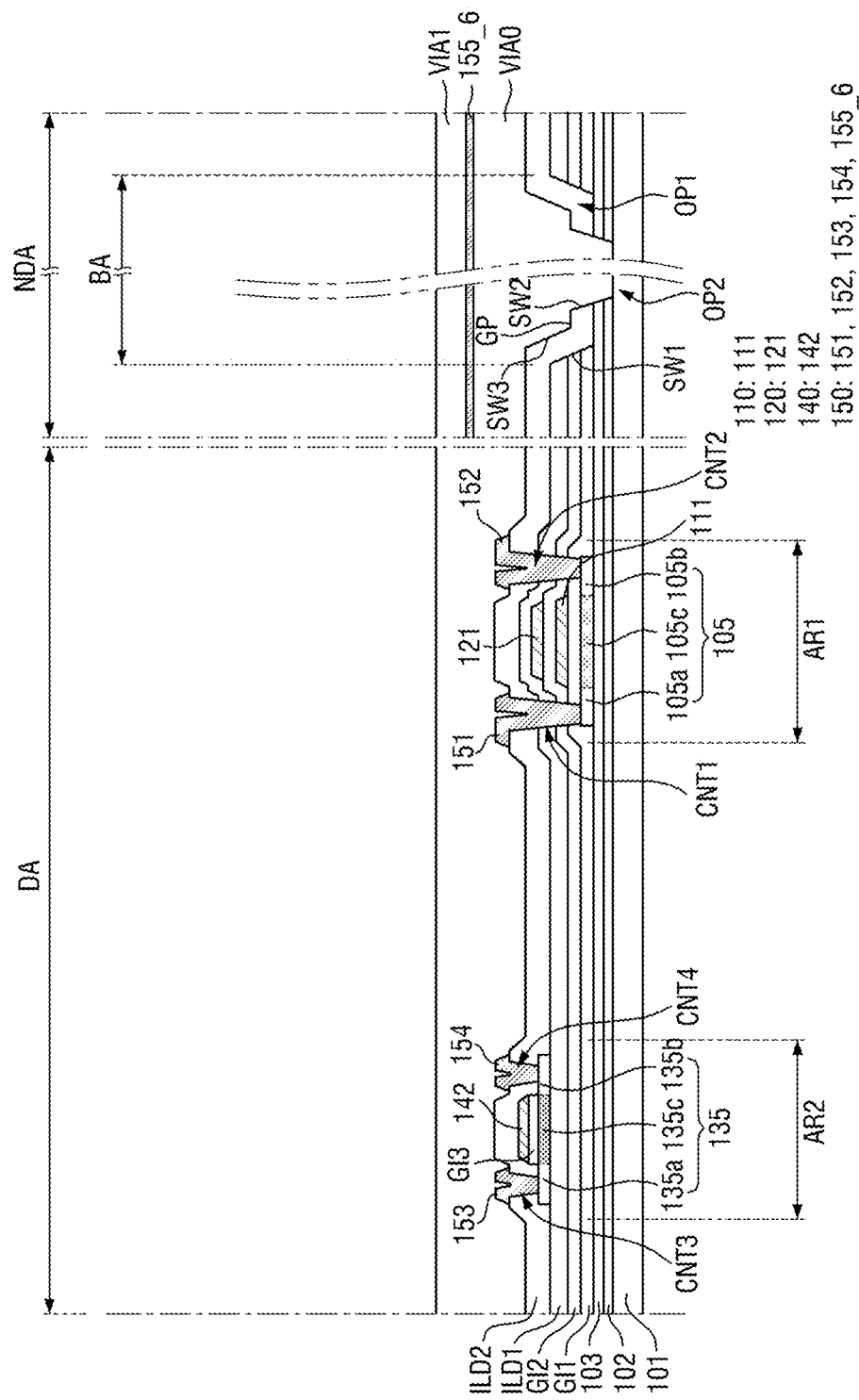

FIG. 32 is a partial flowchart illustrating the method of manufacturing the display device according to the embodiment of FIG. 31. FIGS. 33 to 35 are cross-sectional views illustrating process operations of the method of manufacturing the display device according to the embodiment of FIG. 31.

Referring to FIGS. 32 and 33, as described above, a bending opening OP2 may be formed by operations S04 and S06 of forming an oxide semiconductor pattern and first to fourth contact holes CNT1, CNT2, CNT3, and CNT4. After the operations S04 and S06, a bending via layer VIA0 may be formed on the bending opening OP2 (S06_6). The bending opening OP2 may be filled with a bending via layer VIA0, and the bending via layer VIA0 may be in contact with an upper surface of a base substrate 101 in the bending opening OP2 and in contact with side surfaces of a barrier layer 102, a buffer layer 103, and a second interlayer insulating film ILD2 and an upper surface of the second interlayer insulating film ILD2.

Subsequently, referring to FIGS. 34 and 35, a fourth conductive layer 150 may be formed on the second interlayer insulating film ILD2 and the bending via layer VIA0 (S07). The fourth conductive layer 150 may include first and second source/drain electrodes 151 and 152 of a transistor located in the silicon transistor region AR1, first and second source/drain electrodes 153 and 154 of a transistor located in the oxide transistor region AR2, and a non-display region line 155_6 located on the bending via layer VIA0.

A first via layer VIA1 may be formed on the fourth conductive layer 150 (S08). The first via layer VIA1 may have the same height in a display region DA and a non-display region NDA.

While the embodiments of the present disclosure have been described with reference to the accompanying drawings, it will be understood by those skilled in the art that various modifications can be made without departing from the scope of the present disclosure and without changing essential features. Therefore, the above-described embodiments should be considered in a descriptive sense only and not for purposes of limitation. Thus, the scope of embodiments of the present disclosure are defined according to the following claims, and their equivalents.

What is claimed is:

1. A display device including a main region having a display region and a bending region which is connected to one side of the main region and bent in a thickness direction thereof with respect to the main region, the display device comprising:
   a substrate;
   a buffer layer on the substrate;
   a first semiconductor layer on the buffer layer;
   a first gate insulating film on the first semiconductor layer;
   a first gate conductive layer on the first gate insulating film;
   a first interlayer insulating film on the first gate conductive layer;
   a second gate conductive layer on the first interlayer insulating film;
   a second interlayer insulating film on the second gate conductive layer;
   a first data conductive layer on the second interlayer insulating film; and
   a first via layer on the first data conductive layer, wherein
   the bending region includes a bending peripheral opening passing through the first interlayer insulating film and the first gate insulating film and a bending opening in the bending peripheral opening and passing through the second interlayer insulating film and the buffer layer to expose the substrate,
   a first sidewall of the bending peripheral opening includes a side surface of the first interlayer insulating film and a side surface of the first gate insulating film,
   the second interlayer insulating film covers the first sidewall of the bending peripheral opening,
   the bending opening includes a second sidewall including a side surface of the buffer layer and a portion of a side surface of the second interlayer insulating film arranged with the side surface of the buffer layer, and
   the first via layer fills the bending opening.

2. The display device of claim 1, wherein the bending opening further includes a third sidewall formed of another portion of the side surface of the second interlayer insulating film, which covers the first sidewall, and a stepped portion between the second sidewall and the third sidewall.

3. The display device of claim 2, wherein the stepped portion is formed of a partial upper surface of the second interlayer insulating film.

4. The display device of claim 1, further comprising:
   a second gate insulating film on the first gate conductive layer; and
   a conductive layer of a capacitor on the second gate insulating film,
   wherein the first sidewall of the bending peripheral opening further includes a side surface of the second gate insulating film.

5. The display device of claim 4, wherein the first sidewall further includes a partial side surface of an upper side of the buffer layer.

6. The display device of claim 5, wherein a thickness of the buffer layer in a region in which the bending peripheral opening overlaps the buffer layer is smaller than a thickness of the buffer layer in a region in which the bending peripheral opening does not overlap the buffer layer.

7. The display device of claim 1, further comprising a barrier layer on the substrate,
   wherein the barrier layer is between the substrate and the buffer layer, and
   the second sidewall of the bending opening further includes a side surface of the barrier layer.

8. The display device of claim 1, further comprising:
   a second semiconductor layer on the first interlayer insulating film; and
   a third gate insulating film on the second semiconductor layer.

9. The display device of claim 8, wherein the third gate insulating film overlaps the second gate conductive layer.

10. The display device of claim 2, wherein the second sidewall and the third sidewall are formed on an inner side of the first sidewall.

11. The display device of claim 10, wherein a distance by which the second sidewall protrudes from the first sidewall is greater than a distance by which the third sidewall protrudes from the first sidewall.

12. The display device of claim 1, wherein a distance by which the second sidewall protrudes from the first sidewall at one side of the bending region is different from a distance by which the second sidewall protrudes from the first sidewall at the other side of the bending region.

13. A display device including a main region having a display region and a bending region which is connected to one side of the main region and bent in a thickness direction thereof with respect to the main region, the display device comprising:
   a substrate;
   a first transistor including a non-oxide semiconductor on the substrate;
   a second transistor including an oxide semiconductor on a different layer from the non-oxide semiconductor on the substrate;
   a capacitor on the substrate;
   a first inorganic film on the substrate;
   a second inorganic film on the first inorganic film and including a first sidewall; and
   a third inorganic film on the second inorganic film, the first sidewall, and a portion of the first inorganic film which protrudes from the second inorganic film, wherein the bending region includes a bending peripheral opening defined by the first sidewall and a bending opening defined by a second sidewall, a third sidewall, and a stepped portion which connects the second sidewall to the third sidewall, the second sidewall is formed of a side surface of the second inorganic film, and a portion of a side surface of the third inorganic film on the portion of the first inorganic film protruding from the second inorganic film, the third sidewall is formed of another portion of an upper surface of the third inorganic film on the first sidewall, and the portion of the third inorganic film on the portion of the first inorganic film protruding from the second inorganic film is formed on the same layer as a semiconductor layer of the non-oxide semiconductor of the first transistor.

14. The display device of claim 13, wherein:

the bending opening is filled with an organic layer; and the organic layer is in direct contact with the substrate.

15. The display device of claim 13, wherein any one of the first transistor and the second transistor is a p-type metal-oxide-semiconductor (PMOS) transistor, and the other one is an n-type metal-oxide-semiconductor (NMOS) transistor.

* * * * *